US012560744B2

(12) United States Patent
Suzuki et al.

(10) Patent No.: US 12,560,744 B2
(45) Date of Patent: Feb. 24, 2026

(54) ANTIREFLECTIVE MEMBER, AND POLARIZING PLATE, IMAGE DISPLAY DEVICE, AND ANTIREFLECTIVE ARTICLE IN WHICH SAID ANTIREFLECTIVE MEMBER IS USED, AS WELL AS METHOD FOR SELECTING ANTIREFLECTIVE MEMBER

(71) Applicant: DAI NIPPON PRINTING CO., LTD., Tokyo (JP)

(72) Inventors: Sho Suzuki, Sendai (JP); Yoshinari Matsuda, Okayama (JP); Atsushi Horii, Okayama (JP); Noriaki Kawakita, Saitama (JP); Keisuke Endou, Kashiwa (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 497 days.

(21) Appl. No.: 18/004,780

(22) PCT Filed: Jul. 13, 2021

(86) PCT No.: PCT/JP2021/026233
§ 371 (c)(1),
(2) Date: Jan. 9, 2023

(87) PCT Pub. No.: WO2022/014560
PCT Pub. Date: Jan. 20, 2022

(65) Prior Publication Data
US 2023/0258845 A1      Aug. 17, 2023

(30) Foreign Application Priority Data

Jul. 15, 2020    (JP) ................................. 2020-121363

(51) Int. Cl.
*B32B 3/02* (2006.01)
*B32B 3/14* (2006.01)
(Continued)

(52) U.S. Cl.
CPC ................ *G02B 1/111* (2013.01); *B32B 3/02* (2013.01); *B32B 3/14* (2013.01); *G02B 1/14* (2015.01);
(Continued)

(58) Field of Classification Search
CPC ............. G02B 1/111; B32B 3/02; B32B 3/30; B32B 3/263
See application file for complete search history.

(56) References Cited

U.S. PATENT DOCUMENTS 12,265,203 B2 *    4/2025   Kozakai .................. G02B 1/111

FOREIGN PATENT DOCUMENTS

JP         2007-078711         3/2007
JP         2008-268357         11/2008
(Continued)

OTHER PUBLICATIONS

International Search Report of PCT/JP2021/026233, Aug. 31, 2021, 6 pages including English translation.

*Primary Examiner* — Elizabeth E Mulvaney
(74) *Attorney, Agent, or Firm* — HSML P.C.

(57) ABSTRACT

Provided is an antireflective member capable of improving scratch resistance. An antireflective member having a low refractive index layer on an optically transmissive substrate, the low refractive index layer containing a binder resin and hollow particles, wherein the antireflective member satisfies the following condition 1. <condition 1> In a region of 5 $\mu$m×5 $\mu$m on a surface of the antireflective member on a side having the low refractive index layer with respect to the optically transmissive substrate, spatial frequency analysis (Continued)

100 of elevation is performed to calculate power spectrum intensity of elevation for each wavelength; when a sum of power spectrum intensity of elevation for each wavelength is calculated and the sum is normalized to 1, the power spectrum intensity P1 of elevation at a wavelength of 1.25 µm is 0.015 or more.

12 Claims, 8 Drawing Sheets

(51) Int. Cl.

| | |
|---|---|
| *G02B 1/111* | (2015.01) |
| *G02B 1/14* | (2015.01) |
| *G02B 5/30* | (2006.01) |
| *G02F 1/1335* | (2006.01) |
| *H10H 20/855* | (2025.01) |
| *H10K 59/80* | (2023.01) |

(52) U.S. Cl.

CPC ..... *G02B 5/3025* (2013.01); *G02F 1/133502* (2013.01); *H10H 20/855* (2025.01); *G02F 2201/50* (2013.01); *H10K 59/8791* (2023.02)

(56) References Cited

FOREIGN PATENT DOCUMENTS

| | | |
|---|---|---|
| JP | 2014-016476 | 1/2014 |
| JP | 6011527 B2 | 10/2016 |
| JP | 2018-128541 | 8/2018 |
| JP | 2018-533068 | 11/2018 |
| JP | 2018-533762 | 11/2018 |
| WO | 2012/157682 | 11/2012 |
| WO | 2019/139150 | 7/2019 |

* cited by examiner

[Fig. 1]
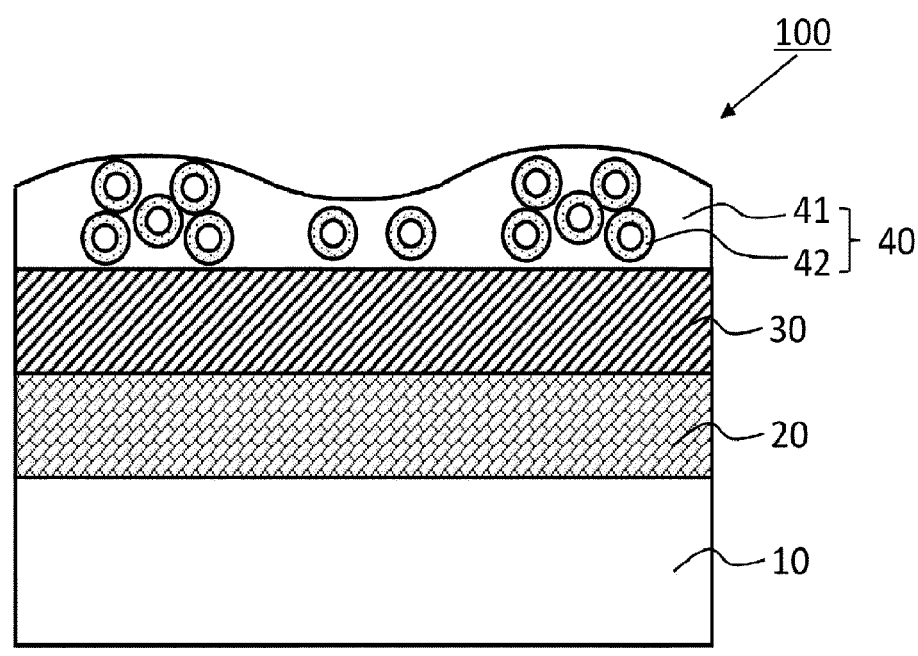
[Fig. 2]
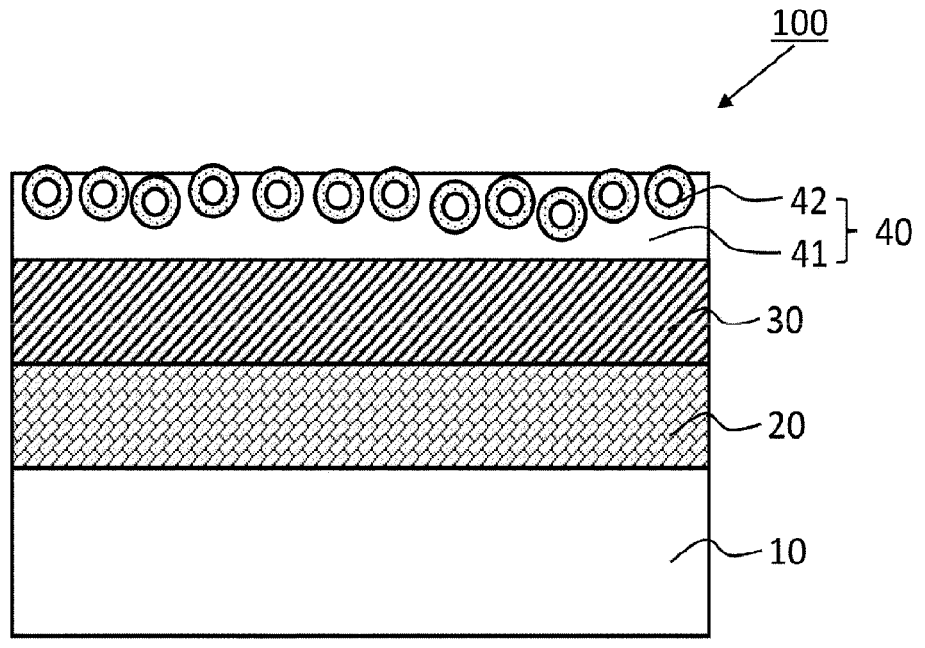

[Fig. 3]
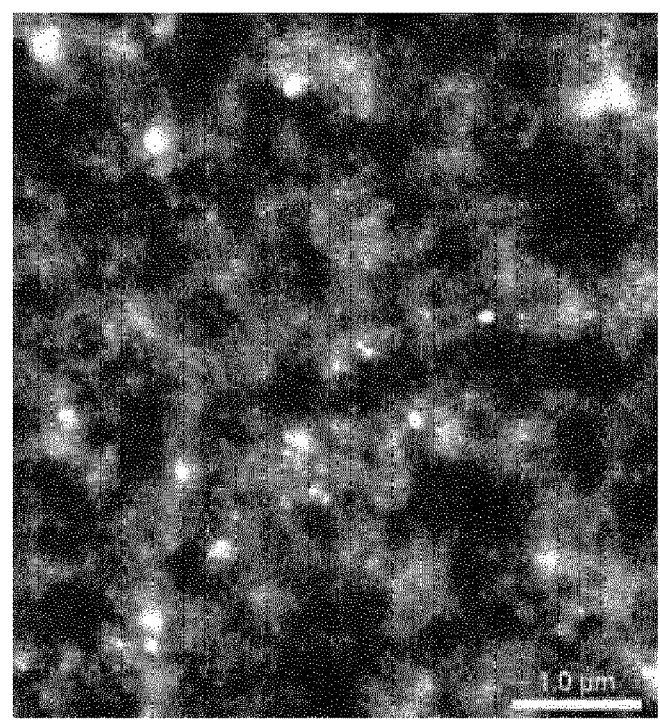
[Fig. 4]
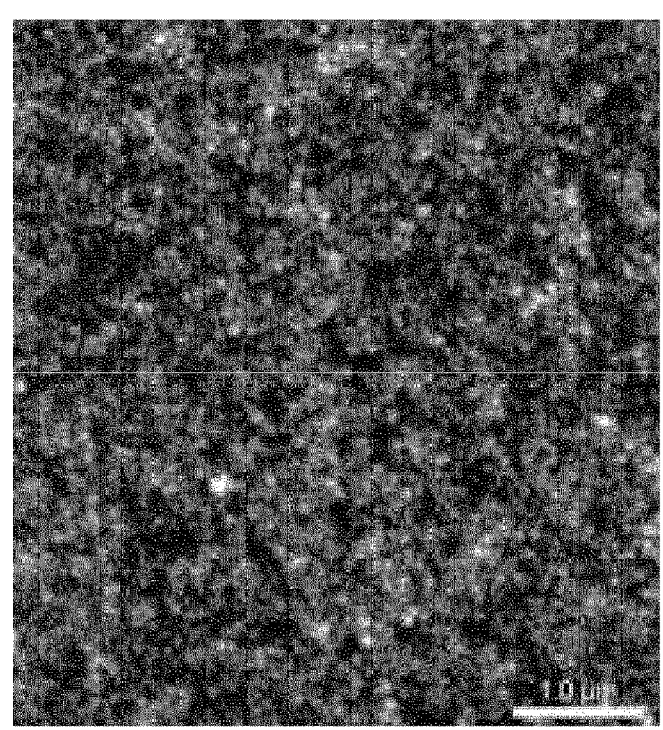

[Fig. 5]
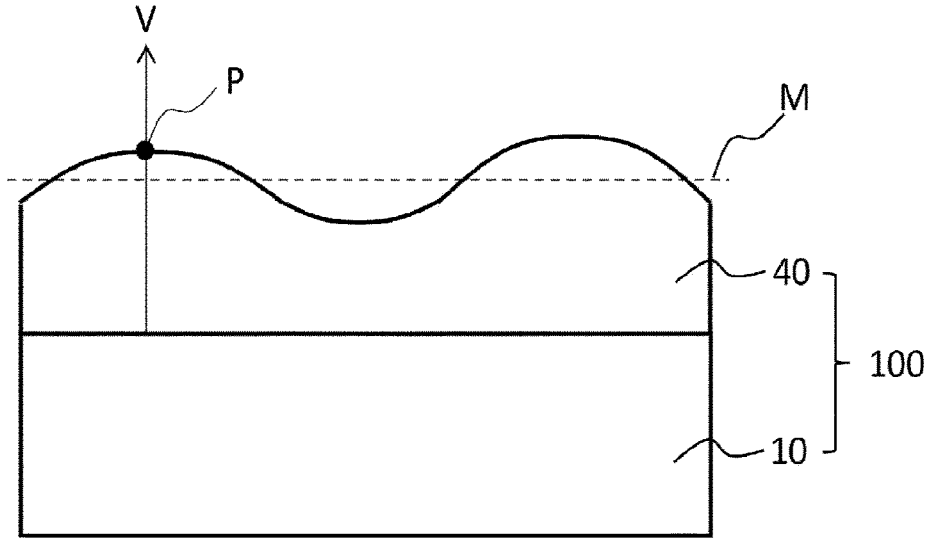
[Fig. 6]
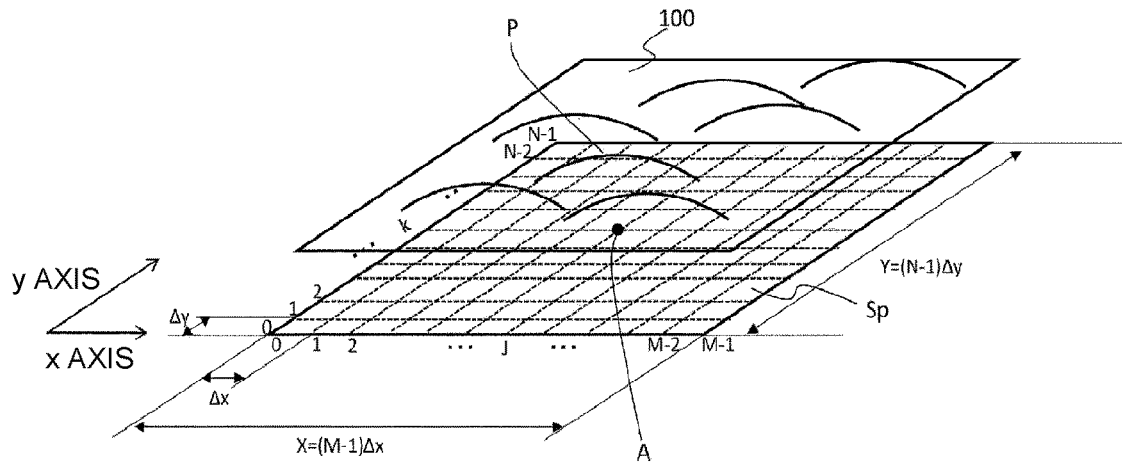

[Fig. 7]
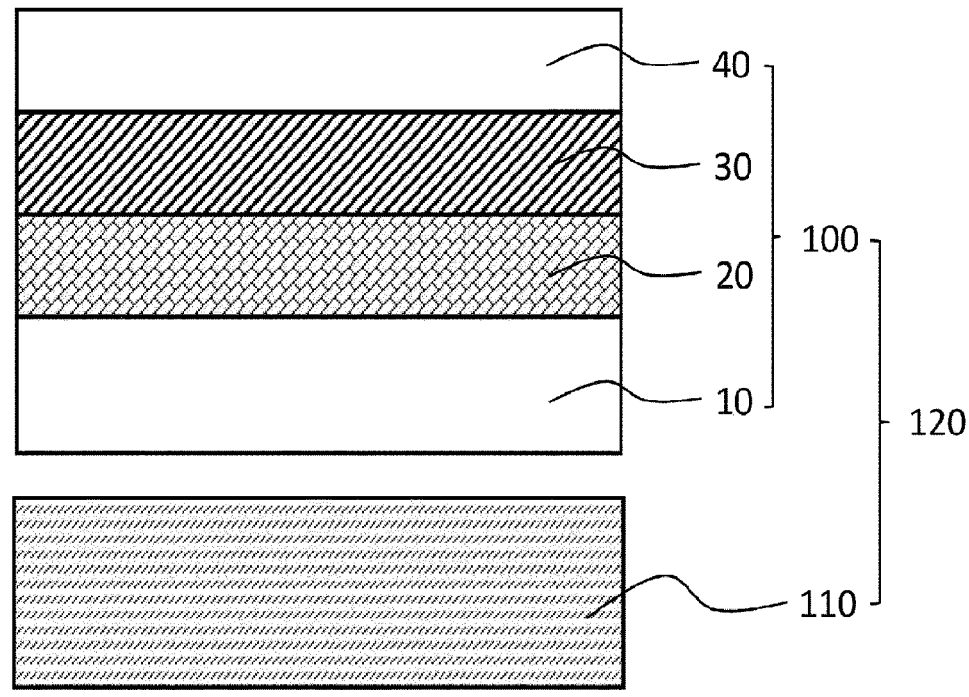

[Fig. 8]
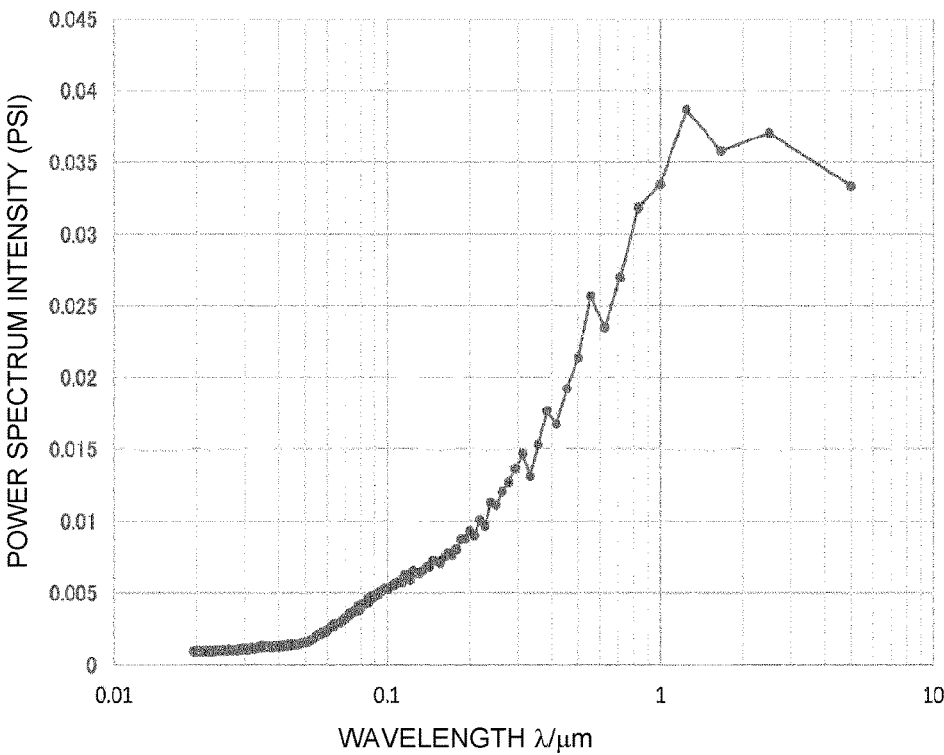
[Fig. 9]
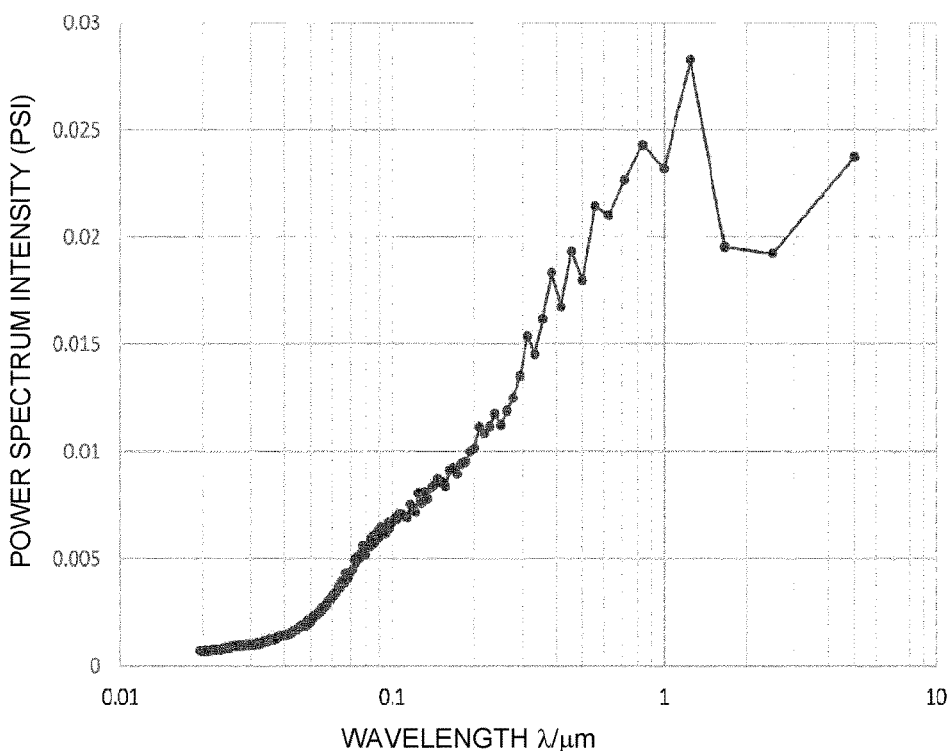

[Fig. 10]
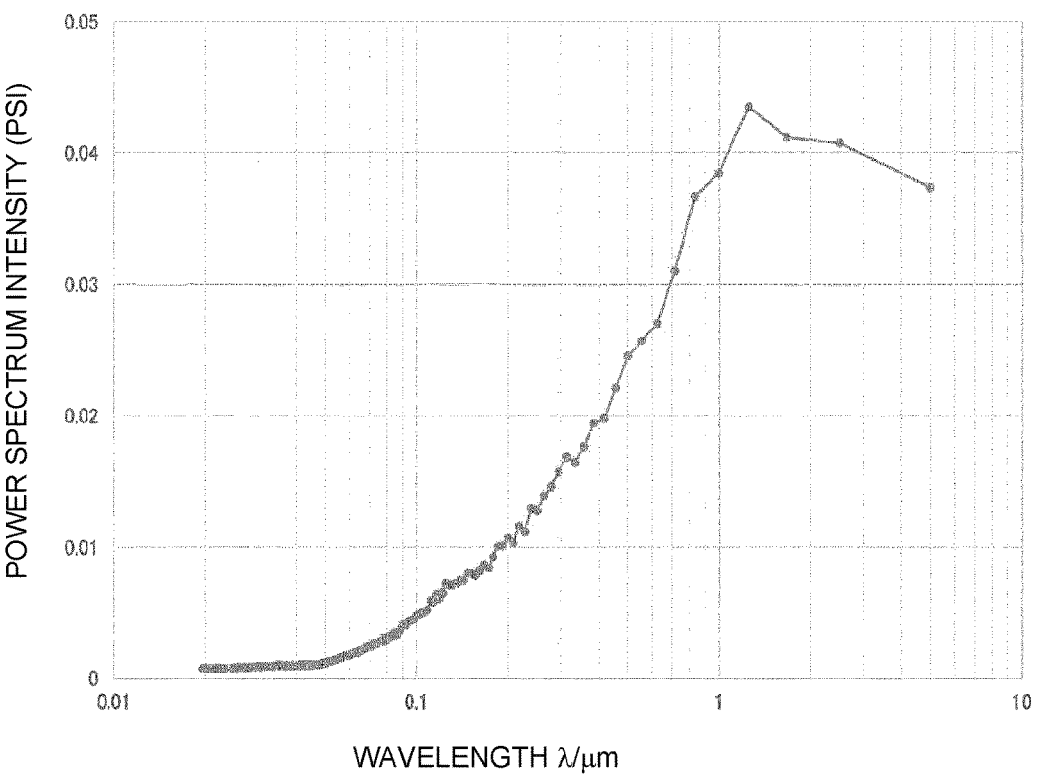
[Fig. 11]
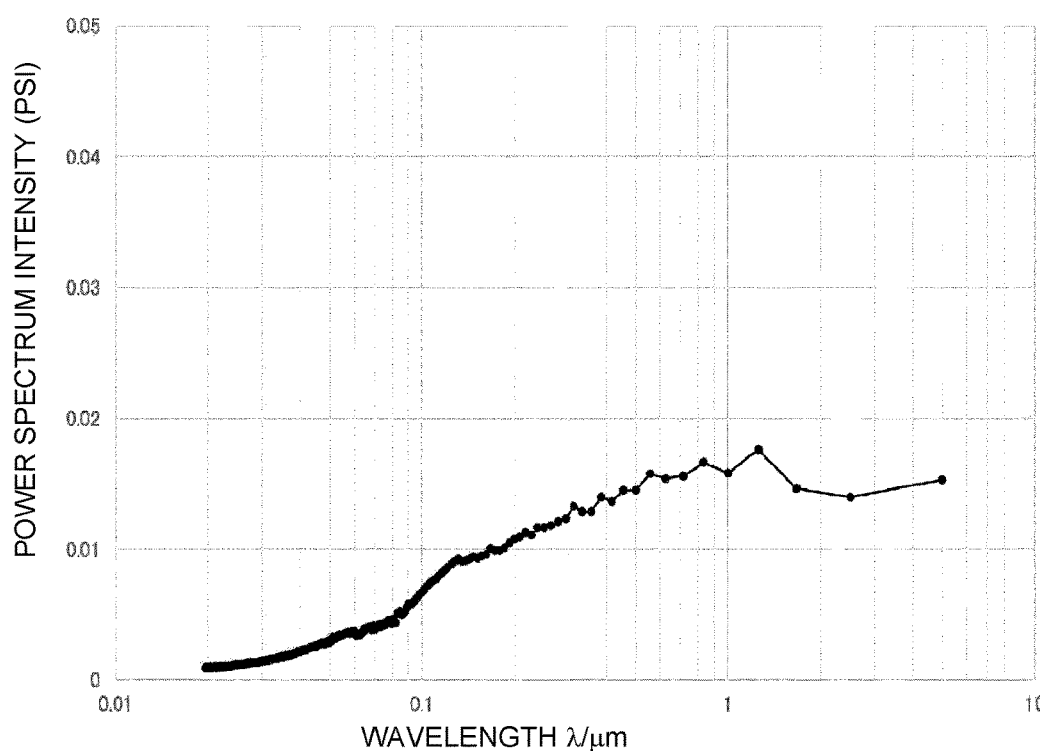

[Fig. 12]
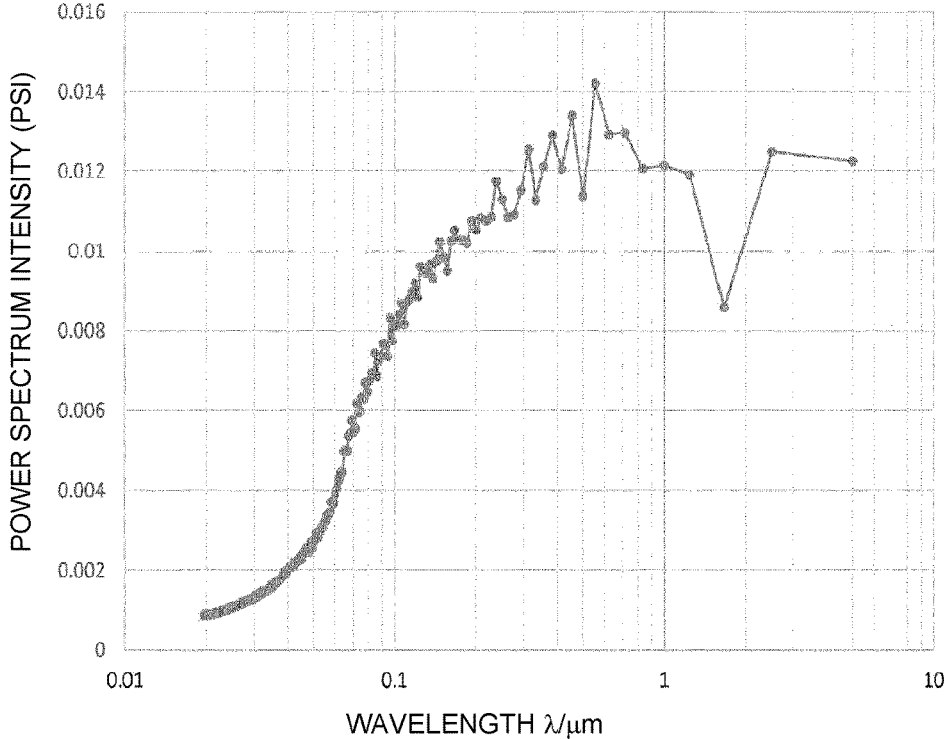
[Fig. 13]
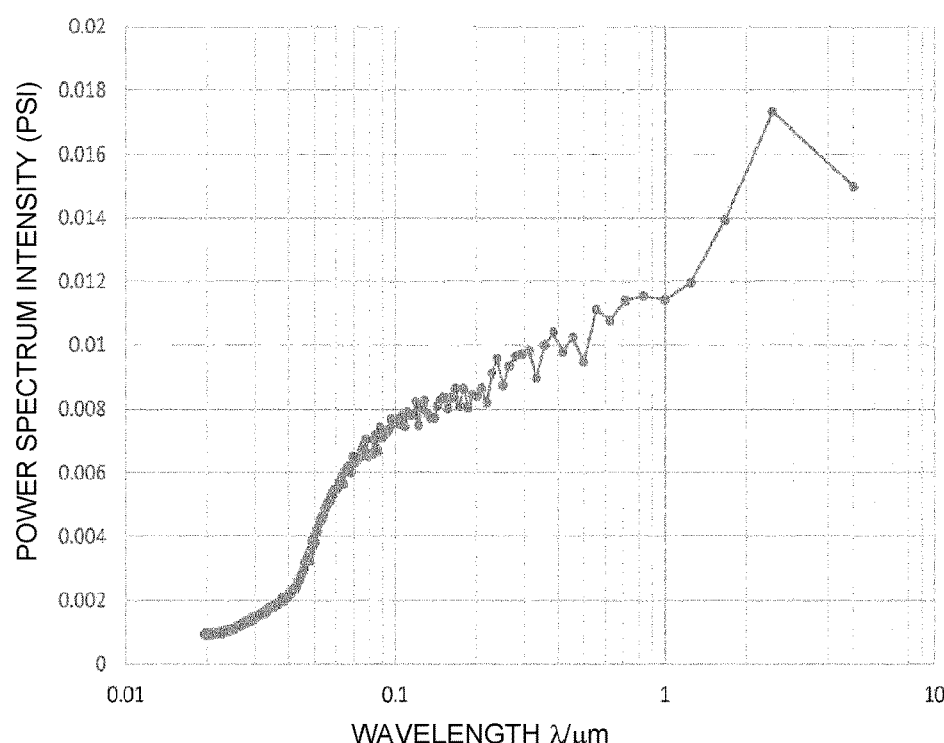

[Fig. 14]
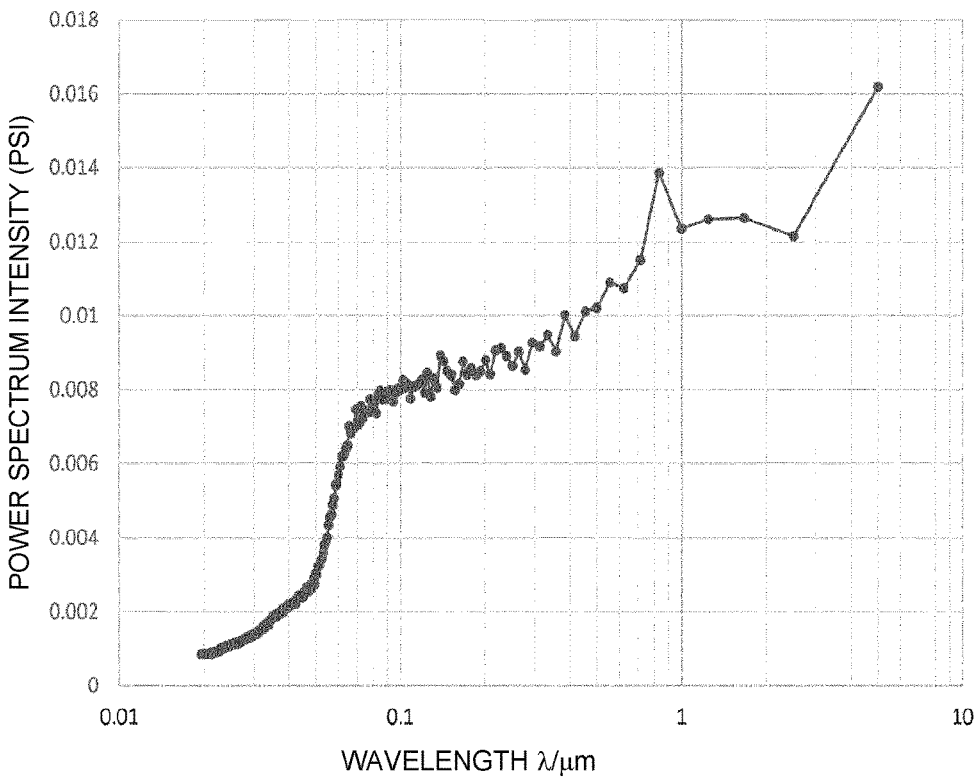
[Fig. 15]
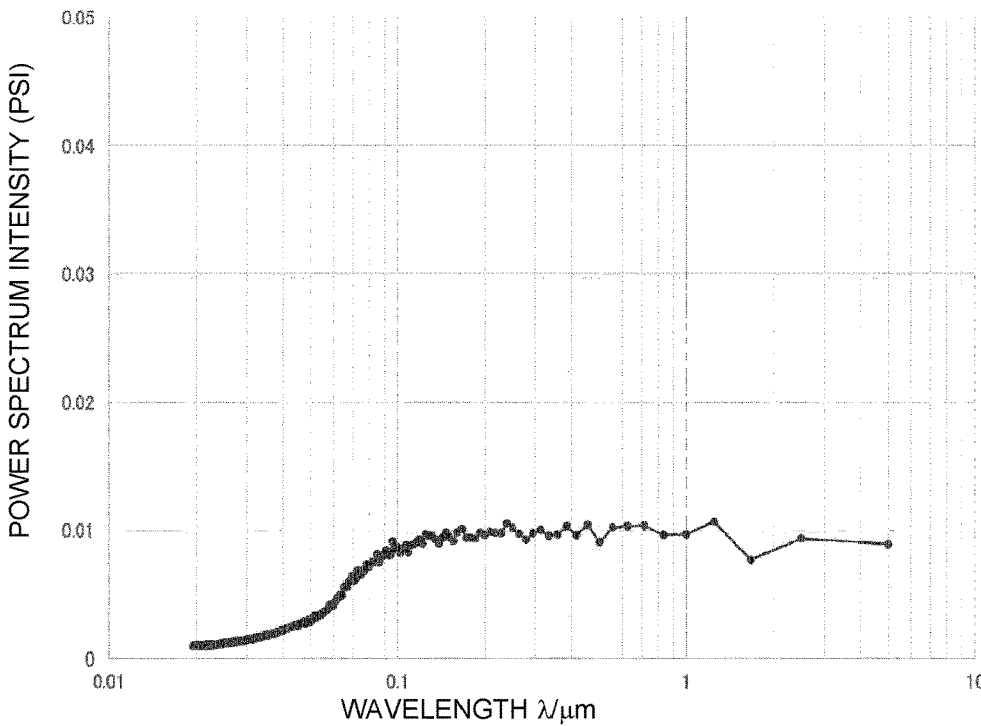

ANTIREFLECTIVE MEMBER, AND POLARIZING PLATE, IMAGE DISPLAY DEVICE, AND ANTIREFLECTIVE ARTICLE IN WHICH SAID ANTIREFLECTIVE MEMBER IS USED, AS WELL AS METHOD FOR SELECTING ANTIREFLECTIVE MEMBER

TECHNICAL FIELD

The present disclosure relates to an antireflective member, and a polarizing plate, an image display device, and an antireflective article in which the antireflective member is used, as well as a method for selecting an antireflective member.

BACKGROUND ART

It is known that antireflective members are provided on device surfaces in, for example, display devices such as liquid crystal display devices, organic EL display devices and micro LED display devices, and showcases, for the purpose of an improvement in visibility. In recent years, touch panel type image display devices, such as in-vehicle displays such as car navigation equipment, tablets, and smartphones, which are operated by direct contact of hands of users with screens, are widespread, and antireflective members have also been provided on the touch panel type image display devices.

The antireflective member is produced, for example, by forming an antireflective layer on an optically transmissive substrate. Known methods for producing antireflective layers include a dry method in which an inorganic thin film having a different refractive index is formed by a sputtering method or the like, and a wet method in which a resin layer containing fine particles is formed by coating.

In general, an antireflective member having a resin layer has advantages in that a change of a slanted reflection color phase is small, chemical stability such as alkali resistance is excellent, and the antireflective member is inexpensive, as compared with an antireflective member having an inorganic thin film, and has excellent versatility. However, an antireflective member having a resin layer tends to be inferior in mechanical properties such as scratch resistance, as compared with an antireflective member having an inorganic thin film. Therefore, an antireflective member having a resin layer is required to have improved scratch resistance.

In an antireflective member having a resin layer, for example, in PTLs 1 and 2, a low refractive index layer contains hollow inorganic nanoparticles such as silica and solid inorganic nanoparticles. Furthermore, the solid inorganic nanoparticles are eccentrically located at an interface with a hardcoat, and the hollow inorganic nanoparticles are eccentrically located opposite to the interface. By doing so, both high scratch resistance and low reflectance are achieved.

PTL 3 discloses an enhancement in surface hardness by allowing reactive silica fine particles in a low refractive index layer to be eccentrically located at an interface with a hardcoat layer and/or an interface opposite to the hardcoat layer, to thereby allow hollow silica fine particles to be densely packed in the low refractive index layer.

PTL 4 discloses formation of an antireflective film on an optical substrate in which hollow silica fine particles and fine silica particles are dispersed in a binder containing reactive silanes as a main component.

CITATION LIST

Patent Literature

PTL 1: JP 2018-533068 A
PTL 2: JP 2018-533762 A
PTL 3: JP 6011527 B
PTL 4: JP 2007-078711 A

SUMMARY OF INVENTION

Technical Problem

However, the antireflective members having a resin layer of PTLs 1 to 4 could not obtain steel wool resistance equivalent to that of the antireflective members having an inorganic thin film. The antireflective members of PTLs 1 to 4 contain hollow particles in the low refractive index layer in order to achieve low reflectance. The hollow particles easily achieve low reflectance, but have low strength. For this reason, the antireflective members of PTLs 1 to 4 containing hollow particles are considered difficult to achieve excellent steel wool resistance.

Antireflective members are often applied to a portion, such as a touch panel, which is frequently touched by a human hand. For this reason, antireflective members that do not have good steel wool resistance do not have high versatility.

An object of the present disclosure is to provide an antireflective member having a low refractive index layer containing hollow particles, and a polarizing plate, an image display device, and an antireflective article using the same, in order to improve scratch resistance. Another object of the present disclosure is to provide a method for selecting an antireflective member having a low refractive index layer containing hollow particles, which can improve scratch resistance.

Solution to Problem

The present disclosure provides the following [1] to [5].
[1] An antireflective member comprising a low refractive index layer on an optically transmissive substrate, the low refractive index layer comprising a binder resin and hollow particles, wherein the antireflective member satisfies the following condition 1;
<Condition 1>
in a region of 5 $\mu$m×5 $\mu$m on a surface of the antireflective member on a side having the low refractive index layer with respect to the optically transmissive substrate, spatial frequency analysis of elevation is performed to calculate power spectrum intensity of elevation for each wavelength; after calculating a sum of power spectrum intensities of elevations at all measurement wavelengths, the sum is normalized to 1; and when power spectrum intensity of elevation at a wavelength of 1.25 $\mu$m to the sum of power spectrum intensities of elevations normalized to 1 is defined as P1, P1 is 0.015 or more.
[2] A polarizing plate comprising a polarizer, a first transparent protective plate disposed on one side of the polarizer, and a second transparent protective plate disposed on the other side of the polarizer, wherein any one of the first transparent protective plate and the second transparent protective plate is the antireflective member according to [1], and the antireflective member is disposed such that a surface of the antireflective member on the optically transmissive substrate side faces the polarizer side.

[3] An image display device comprising:

a display element; and the antireflective member according to [1] disposed on the display element such that a surface of the antireflective member on the low refractive index layer side is disposed so as to face the opposite side to the display element, the antireflective member being disposed on an outermost surface.

[4] An antireflective article wherein the antireflection member according to [1] is disposed on a member so that the surface on the low refractive index layer side faces the side opposite the member, and in which the antireflection member is positioned on the outermost surface.

[5] A method for selecting an antireflective member, the method comprising:

performing evaluation with respect to the following condition 1 on an antireflective member comprising a low refractive index layer on an optically transmissive substrate, the low refractive index layer comprising a binder resin and hollow particles; and selecting an antireflective member satisfying the following condition 1:

<Condition 1> in a region of 5 μm×5 μm on a surface of the antireflective member on a side having the low refractive index layer with respect to the optically transmissive substrate, spatial frequency analysis of elevation is performed to calculate power spectrum intensity of elevation for each wavelength; after calculating a sum of power spectrum intensities of elevations at all measurement wavelengths, the sum is normalized to 1; and when power spectrum intensity of elevation at a wavelength of 1.25 μm to the sum of power spectrum intensities of elevations normalized to 1 is defined as P1, P1 is 0.015 or more.

Advantageous Effects of Invention

The antireflective member of the present disclosure, and a polarizing plate, an image display device, and an antireflective article using the same can improve scratch resistance. The method for selecting an antireflective member of the present disclosure can select an antireflective member having excellent scratch resistance without performing scratch resistance test.

BRIEF DESCRIPTION OF DRAWINGS

FIG. 1 is a schematic cross-sectional view showing one embodiment of an antireflective member of the present disclosure.

FIG. 2 is a schematic cross-sectional view showing one embodiment of a conventional antireflective member.

FIG. 3 is an image of a surface of an antireflective member of Example 1 on the low refractive index layer side imaged with an atomic force microscope.

FIG. 4 is an image of a surface of an antireflective member of Comparative Example 1 on the low refractive index layer side imaged with an atomic force microscope.

FIG. 5 is a view for explaining a method of calculating power spectrum intensity of elevation for each wavelength on the surface on the low refractive index layer side.

FIG. 6 is a view for explaining a method of calculating power spectrum intensity of elevation for each wavelength on the surface on the low refractive index layer side.

FIG. 7 is a cross-sectional view showing one embodiment of an image display device of the present disclosure.

FIG. 8 is a view showing a ratio of power spectrum intensity of elevation at each wavelength to a sum of power spectrum intensities of elevations at all measurement wavelengths with respect to the antireflective member of Example 1, provided that the sum is normalized to 1.

FIG. 9 is a view showing a ratio of power spectrum intensity of elevation at each wavelength to a sum of power spectrum intensities of elevations at all measurement wavelengths with respect to the antireflective member of Example 2, provided that the sum is normalized to 1.

FIG. 10 is a view showing a ratio of power spectrum intensity of elevation at each wavelength to a sum of power spectrum intensities of elevations at all measurement wavelengths with respect to the antireflective member of Example 3, provided that the sum is normalized to 1.

FIG. 11 is a view showing a ratio of power spectrum intensity of elevation at each wavelength to a sum of power spectrum intensities of elevations at all measurement wavelengths with respect to the antireflective member of Example 4, provided that the sum is normalized to 1.

FIG. 12 a view showing a ratio of power spectrum intensity of elevation at each wavelength to a sum of power spectrum intensities of elevations at all measurement wavelengths with respect to the antireflective member of Comparative Example 1, provided that the sum is normalized to 1.

FIG. 13 a view showing a ratio of power spectrum intensity of elevation at each wavelength to a sum of power spectrum intensities of elevations at all measurement wavelengths with respect to the antireflective member of Comparative Example 2, provided that the sum is normalized to 1.

FIG. 14 a view showing a ratio of power spectrum intensity of elevation at each wavelength to a sum of power spectrum intensities of elevations at all measurement wavelengths with respect to the antireflective member of Comparative Example 3, provided that the sum is normalized to 1.

FIG. 15 a view showing a ratio of power spectrum intensity of elevation at each wavelength to a sum of power spectrum intensities of elevations at all measurement wavelengths with respect to the antireflective member of Comparative Example 4, provided that the sum is normalized to 1.

DESCRIPTION OF EMBODIMENTS

Embodiments of the present disclosure will be described below.

Antireflective Member

An antireflective member of the present disclosure is an antireflective member having a low refractive index layer on an optically transmissive substrate, the low refractive index layer containing a binder resin and hollow particles, wherein the antireflective member satisfies the following condition 1.

<Condition 1>

In a region of 5 μm×5 μm on a surface of the antireflective member on a side having the low refractive index layer with respect to the optically transmissive substrate, spatial frequency analysis of elevation is performed to calculate power spectrum intensity of elevation for each wavelength; after calculating a sum of power spectrum intensities of elevations at all measurement wavelengths, the sum is normalized to 1; and when power spectrum intensity of elevation at a wavelength of 1.25 μm to the sum of power spectrum intensities of elevations normalized to 1 is defined as P1, P1 is 0.015 or more.

FIG. 1 is a schematic cross-sectional view of a cross-sectional shape of an antireflective member 100 of the present disclosure.

The antireflective member 100 of FIG. 1 has a low refractive index layer 40 containing a binder resin 41 and hollow particles 42 on an optically transmissive substrate 10. The antireflective member 100 of FIG. 1 has a hardcoat layer 20 and a high refractive index layer 30 between the optically transmissive substrate 10 and the low refractive index layer 40.

FIG. 1 is a schematic cross-sectional view. That is, the scale of each layer constituting the antireflective member 100 and the scale of each material are schematic for ease of illustration, and thus are different from the actual scale and the like. The same applies to FIGS. 2, 5, and 7.

In the antireflective member 100 in FIG. 1, the upper surface in FIG. 1 corresponds to "the surface of the antireflective member on the side having the low refractive index layer with respect to the optically transmissive substrate."

In the present specification, "the surface of the antireflective member on the side having the low refractive index layer with respect to the optically transmissive substrate" may be referred to as "the surface on the low refractive index layer side."

The antireflective member of the present disclosure is not limited to the laminated structure shown in FIG. 1 as long as the antireflective member has a low refractive index layer containing a binder resin and hollow particles on an optically transmissive substrate and satisfies the condition 1. For example, the antireflective member may have a laminated structure in which at least one of the hardcoat layer and the high refractive index layer is removed from the laminated structure of FIG. 1. A preferred embodiment of the laminated structure of the antireflective member is the laminated structure shown in FIG. 1, in which a hardcoat layer, a high refractive index layer, and a low refractive index layer are provided in this order on the optically transmissive substrate.

<Optically Transmissive Substrate>

The optically transmissive substrate preferably has optical transmitting properties, smoothness, heat resistance, and excellent mechanical strength. Examples of such an optically transmissive substrate include plastic films such as polyester, triacetyl cellulose (TAC), cellulose diacetate, cellulose acetate butyrate, polyamide, polyimide, polyether sulfone, polysulfone, polypropylene, polymethylpentene, polyvinyl chloride, polyvinyl acetal, polyether ketone, polymethyl methacrylate, polycarbonate, polyurethane, and amorphous olefin (Cyclo-Olefin-Polymer: COP). The optically transmissive substrate may be a laminate of two or more plastic films.

Among the above, from the viewpoint of mechanical strength and the dimensional stability, a polyester such as polyethylene terephthalate or polyethylene naphthalate subjected to a stretching process, particularly, a biaxial stretching process is preferable. TAC and acrylic are preferable from the viewpoint of optical transmittance and optical isotropy. COP and polyester are preferable in terms of excellent weather resistance.

The thickness of the optically transmissive substrate is preferably 5 μm or more and 300 μm or less, more preferably 20 μm or more and 200 μm or less, and still more preferably 30 μm or more and 120 μm or less.

When it is desired to reduce the thickness of the antireflective member, the upper limit of the thickness of the optically transmissive substrate is preferably 60 μm, and more preferably 50 μm. When the optically transmissive substrate is a low moisture-permeable substrate such as polyester, COP, or acrylic, the upper limit of the thickness of the optically transmissive substrate for forming a thin film is preferably 40 μm, and more preferably 20 μm. Even in the case of a large screen, when the upper limit of the thickness of the optically transmissive substrate is within the aforementioned range, strain is less likely to occur, which is also preferable.

The thickness of the optically transmissive substrate can be measured with Digimatic standard outside micrometer (product number "MDC-25SX" available from MITU-TOYO CORPORATION) or the like. The thickness of the optically transmissive substrate may be the average of the values measured at any ten points.

Examples of the preferred range of the thickness of the optically transmissive substrate include 5 μm or more and 300 μm or less, 5 μm or more and 200 μm or less, 5 μm or more and 120 μm or less, 5 μm or more and 60 μm or less, 5 μm or more and 50 μm or less, 5 μm or more and 40 μm or less, 5 μm or more and 20 μm or less, 20 μm or more and 300 μm or less, 20 μm or more and 200 μm or less, 20 μm or more and 120 μm or less, 20 μm or more and 60 μm or less, 20 μm or more and 50 μm or less, 20 μm or more and 40 μm or less, 30 μm or more and 300 μm or less, 30 μm or more and 200 μm or less, 30 μm or more and 120 μm or less, 30 μm or more and 60 μm or less, 30 μm or more and 50 μm or less, and 30 μm or more and 40 μm or less.

A surface of the optically transmissive substrate may be subjected to a physical treatment such as a corona discharge treatment or a chemical treatment, or an easily adhesive layer may be formed on the surface of the transparent substrate to improve adhesiveness.

The antireflective member of the present disclosure needs to satisfy the condition 1.

<Condition 1>

In a region of 5 μm×5 μm on a surface of the antireflective member on a side having the low refractive index layer with respect to the optically transmissive substrate, spatial frequency analysis of elevation is performed to calculate power spectrum intensity of elevation for each wavelength; after calculating a sum of power spectrum intensities of elevations at all measurement wavelengths, the sum is normalized to 1; and when power spectrum intensity of elevation at a wavelength of 1.25 μm to the sum of power spectrum intensities of elevations normalized to 1 is defined as P1, P1 is 0.015 or more.

In the present specification, the number of data acquisition points (=number of pixels) per row and column in the measurement region of 5 μm×5 μm is 512 pt×512 pt. Therefore, in the present specification, the wavelengths (μm) at which the power spectrum intensity of elevation is obtained are 256 points: "5/1, 5/2, 5/3, 5/4, . . . , 5/255, 5/256"

When another layer is not provided on the low refractive index layer of the antireflective member, spatial frequency analysis of elevation may be performed on the surface of the low refractive index layer. When another layer such as an anti-fouling layer and an anti-static layer is provided on the low refractive index layer, spatial frequency analysis of elevation may be performed on the surface of the other layer.

In the present specification, "elevation" means "elevation of the surface on the low refractive index layer side". In the present specification, "elevation of the surface on the low refractive index layer side" means the linear distance in the direction of the normal V of the antireflective member between any point P on the surface of the antireflective member on the side having the low refractive index layer with respect to the optically transmissive substrate and a virtual plane M having an average height of the surface (see FIG. 5). The elevation of the virtual plane M is set to 0 μm as a reference. The direction of the normal V is the normal direction of the virtual plane M. When the elevation of any point P is higher than the average height, the elevation is positive, and when the elevation of any point P is lower than the average height, the elevation is negative.

The wavelength and power spectrum intensity of elevation can be obtained by Fourier transforming the three-dimensional coordinate data of the surface on the low refractive index layer side. A method for calculating the wavelength and power spectrum intensity of elevation from the three-dimensional coordinate data of the surface on the low refractive index layer will be described later.

In the present specification, words including "elevation" mean elevations based on the above average height, unless otherwise specified.

In the condition 1, in a region of 5 μm×5 μm, spatial frequency analysis of elevation of the surface on the low refractive index layer side is performed to calculate power spectrum intensity of elevation for each wavelength. In the condition 1, after calculating the sum of power spectrum intensities of elevations at all measurement wavelengths, the sum is normalized to 1. As described above, the number of data acquisition points (=number of pixels) per row and column in the measurement region of 5 μm×5 μm is 512 pt×512 pt. Therefore, the measurement wavelengths (μm) are 256 points: "5/1, 5/2, 5/3, 5/4, . . . , 5/255, 5/256." Furthermore, in the condition 1, when power spectrum intensity of elevation at a wavelength of 1.25 μm to the sum of power spectrum intensities of elevations normalized to 1 is defined as P1, P1 is 0.015 or more.

The "wavelength" generally correlates with "intervals between the convex portions (periodic intervals of the convex portions)." The "power spectrum intensity of elevation" generally correlates with the "the amount of change in the elevation of the convex portions having a predetermined interval." In the condition 1, the measurement region is 5 μm×5 μm, so the wavelength is in the range of more than 0 μm and 5 μm or less.

That is, the "calculation of the power spectrum intensity of elevation for each wavelength" of the condition 1 can roughly be described as "calculation of the amount of change in the elevation of the convex portions of the surface on the low refractive index layer side for each periodic interval of the convex portions." Then, it can be said that "P 1" indicating "the power spectrum intensity of elevation at a wavelength of 1.25 μm to the sum of power spectrum intensities of elevations normalized to 1" in the condition 1 roughly indicates "the ratio of the amount of change in elevation of the convex portions with a periodic interval of 1.25 μm to the sum of the amount of changes in elevation of the convex portions with various periodic intervals."

Therefore, it can generally be said that "P1 is 0.015 or more" in the condition 1 indicates that "on the surface on the low refractive index layer side, the proportion of the convex portions with a periodic interval of 1.25 μm is equal to or more than a predetermined value."

In general, the average primary particle size of hollow particles is about 50 nm or more and 100 nm or less. Therefore, on the surface of the low refractive index layer side, the "convex portions with a periodic interval of 1.25

μm" are considered to be convex portions formed by aggregation of the hollow particles. In FIG. 1, the hollow particles 42 are not aggregated in the vicinity of the center, but the hollow particles 42 are aggregated on the left side and the right side, and convex portions are formed by the aggregated hollow particles 42. On the other hand, in the conventional antireflective member as shown in FIG. 2, the hollow particles 42 are dispersed without aggregation and are orderly aligned on the surface of the low refractive index layer 40. Although the antireflective member 100 in FIG. 1 has asperity with a large periodic interval, the antireflective member 100 in FIG. 2 does not have asperity with a large periodic interval.

FIGS. 3 and 4 are images of surfaces of the antireflective members of Example 1 and Comparative Example 1 on the low refractive index layer side imaged with an atomic force microscope (AFM). In FIGS. 3 and 4, it is considered that the regions with high density indicate the locations where the hollow particles are present. That is, the antireflective member of Example 1 in FIG. 3 has a region in which the hollow particles are aggregated in the plane, whereas the antireflective member of Comparative Example 1 in FIG. 4 has the hollow particles uniformly dispersed in the plane. As described above, it is also supported by the imaging results of the AFM that the hollow particles are aggregated in the antireflective member of the present disclosure, whereas the hollow particles are dispersed in the conventional antireflective member. The AFM images in FIGS. 3 and 4 are of a 5 μm×5 μm region.

That is, it can be said that P1 of 0.015 or more indicates that there is a large proportion of hollow particles aggregating to form convex portions in the low refractive index layer.

The reason why the scratch resistance is improved when P1 is 0.015 or more is considered as follows.

When FIGS. 1 and 2 are compared with each other, the hollow particles 42 are covered with the binder resin 41 more in FIG. 1 than in FIG. 2. Some of the hollow particles 42 in FIG. 2 are exposed from the surface of the low refractive index layer 40. In the case of the antireflective member 100 of FIG. 2, it is considered that the hollow particles 42 gather in the vicinity of the surface of the low refractive index layer 40 without aggregating, and the binder resin covering the hollow particles in the vicinity of the surface is insufficient, and thus a part of the hollow particles 42 are exposed from the surface of the low refractive index layer 40. On the other hand, in the case of the antireflective member 100 of FIG. 1, it is considered that the hollow particles 42 are present at various positions in the thickness direction of the low refractive index layer, and the binder resin covering the hollow particles in the vicinity of the surface of the low refractive index layer 40 is not insufficient, and thus the hollow particles 42 are covered with the binder resin and are not exposed from the surface of the low refractive index layer 40.

That is, when the P1 is 0.015 or more (when the hollow particles are aggregated in the low refractive index layer to form the convex portions in a large proportion), the surfaces of the hollow particles are easily covered with the binder resins, and thus the number of hollow particles exposed from the surfaces of the low refractive index layer is reduced. In addition, it is considered that since the surfaces of the hollow particles are covered with the binder resin and the number of hollow particles exposed from the surface of the low refractive index layer is reduced, when the surface of the low refractive index layer is rubbed with steel wool or the like, the steel wool or the like does not directly come into contact with the hollow particles having low strength, and thus the scratch resistance can be improved. It is considered that when the binder resin of the low refractive index layer contains a resin having good lubricity or the low refractive index layer contains an additive having good lubricity such as a leveling agent, the surfaces of the hollow particles are covered with the binder resin having good lubricity or the like, and thus good scratch resistance is easily obtained.

Further, it is considered that when P1 is 0.015 or more (when the hollow particles are aggregated in the low refractive index layer to form the convex portions in a large proportion), when steel wool or the like comes into contact with the antireflective member, the contact state is not surface contact but is close to point contact, and thus good scratch resistance is easily obtained.

Conventionally, from the viewpoint of smoothing the surface, it was considered preferable to disperse the hollow particles in the low refractive index layer without aggregating them. The present inventors have found that scratch resistance can be improved by intentionally aggregating the hollow particles, which is completely different from a conventional idea, and further found that the degree of aggregation of the hollow particles can be indicated by power spectrum intensity of elevation, thereby completing the present disclosure.

On the other hand, when P1 is less than 0.015, a part of the hollow particles 42 are exposed from the surface of the low refractive index layer 40 as shown in FIG. 2, and the scratch resistance cannot be improved.

When P1 is less than 0.015, a configuration in which hollow particles sink below the low refractive index layer is also conceivable. When the hollow particles sink below the low refractive index layer, the refractive index in the vicinity of the surface of the low refractive index layer cannot be lowered, so the reflectance cannot be sufficiently lowered.

P1 is more preferably 0.017 or more, preferably 0.020 or more, more preferably 0.025 or more, more preferably 0.028 or more, more preferably 0.030 or more, more preferably 0.032 or more, and more preferably 0.035 or more.

When P1 is too large, SCE (specular component exclude) tends to increase due to the aggregation structure of particles. Therefore, P1 is preferably 0.075 or less, more preferably 0.070 or less, more preferably 0.060 or less, more preferably 0.055 or less, more preferably 0.050 or less, and more preferably 0.045 or less.

In the configuration requirements described in the present specification, when a plurality of options of an upper limit and a plurality of options of a lower limit of a numerical value are shown, one option selected from the options of the upper limit and one option selected from the options of the lower limit can be combined to form an embodiment of a numerical range.

In the case of P1, examples of numerical ranges include 0.015 or more, 0.017 or more, 0.020 or more, 0.025 or more, 0.028 or more, 0.030 or more, 0.032 or more, 0.035 or more, 0.015 or more and 0.075 or less, 0.015 or more and 0.070 or less, 0.015 or more and 0.060 or less, 0.015 or more and 0.055 or less, 0.015 or more and 0.050 or less, 0.015 or more and 0.045 or less, 0.017 or more and 0.075 or less, 0.017 or more and 0.070 or less, 0.017 or more and 0.060 or less, 0.017 or more and 0.055 or less, 0.017 or more and 0.050 or less, 0.017 or more and 0.045 or less, 0.020 or more and 0.075 or less, 0.020 or more and 0.070 or less, 0.020 or more and 0.060 or less, 0.020 or more and 0.055 or less, 0.020 or more and 0.050 or less, 0.020 or more and 0.045 or less, 0.025 or more and 0.075 or less, 0.025 or more and 0.070 or less, 0.025 or more and 0.060 or less, 0.025 or more and 0.055 or less, 0.025 or more and 0.050 or less, 0.025 or more and 0.045 or less, 0.028 or more and 0.075 or less, 0.028 or more and 0.070 or less, 0.028 or more and 0.060 or less, 0.028 or more and 0.055 or less, 0.028 or more and 0.050 or less, 0.028 or more and 0.045 or less, 0.030 or more and 0.075 or less, 0.030 or more and 0.070 or less, 0.030 or more and 0.060 or less, 0.030 or more and 0.055 or less, 0.030 or more and 0.050 or less, 0.030 or more and 0.045 or less, 0.032 or more and 0.075 or less, 0.032 or more and 0.070 or less, 0.032 or more and 0.060 or less, 0.032 or more and 0.055 or less, 0.032 or more and 0.050 or less, 0.032 or more and 0.045 or less, 0.035 or more and 0.075 or less, 0.035 or more and 0.070 or less, 0.035 or more and 0.060 or less, 0.035 or more and 0.055 or less, 0.035 or more and 0.050 or less, and 0.035 or more and 0.045 or less.

In the present specification, various parameters such as numerical values relating to power spectrum intensity of elevation such as P1 and P2, and optical properties such as haze, total optical transmittance, and luminous reflectance Y value mean the average value of measurement values at sixteen points, unless otherwise specified.

In the present specification, for sixteen measurement points, it is preferable that each of the sixteen intersections obtained when a region of 0.5 cm from the outer edge of the measurement sample is removed as a margin and lines are drawn to divide the remaining region into five equal parts in the vertical and horizontal directions is set as a center of measurement. For example, when the measurement sample is a rectangle, it is preferable that the measurement is performed so that each of the intersections at sixteen points obtained when a region of 0.5 cm from the outer edge of the rectangle is removed as a margin and lines are drawn to divide the remaining region into five equal parts in the vertical and horizontal directions is set as a center of measurement, and the parameter is calculated in terms of the average value thereof. When the measurement sample has a shape other than a rectangle such as a circle, an ellipse, a triangle, or a pentagon, it is preferable to draw a rectangle inscribed inside these shapes and measurement is performed at each of the sixteen points of the rectangle according to the above method.

In the present specification, various parameters such as numerical values relating to power spectrum intensity of elevation such as P1 and P2, and optical properties such as haze, total optical transmittance, and luminous reflectance Y value are measured at a temperature of $23\pm5°$ C. and a relative humidity of 40% or more and 65% or less, unless otherwise specified. Further, before starting each measurement, the measurement is performed after exposing the target sample to the atmosphere for 30 minutes or more.

The antireflective member of the present disclosure preferably further satisfies the following condition 2.

<Condition 2>

As in the condition 1, after calculating the sum of power spectrum intensities of elevations at all measurement wavelengths, the sum is normalized to 1; and when power spectrum intensity of elevation at a wavelength of 0.075 $\mu$m to the sum of power spectrum intensities of elevations normalized to 1 is defined as P2, P1/P2 is 4.0 or more.

As described above, in the present specification, the number of data acquisition points (=number of pixels) per row and column in the measurement region of 5 $\mu$m×5 $\mu$m is 512 pt×512 pt. Therefore, more precisely speaking, "0.075 $\mu$m" in the condition 2 is "5/67 [$\mu$m] (0.0746 [$\mu$m])."

Since the average primary particle size of typical hollow particles is 50 nm or more and 100 nm or less, it can be said that the "power spectrum intensity of elevation at a wavelength of 0.075 $\mu$m" in the condition 2 roughly corresponds to the "power spectrum intensity of elevation of the primary particles of the hollow particles." On the other hand, as described above, it can be said that the "power spectrum intensity of elevation at a wavelength of 1.25 μm" roughly corresponds to the "power spectrum intensity of elevation of the convex portions formed by aggregated hollow particles." Therefore, it can be said that the larger the value of "P1/P2" in the condition 2, the higher the ratio of hollow particles aggregated.

P1/P2 of 4.0 or more indicates that the surfaces of the hollow particles are easily covered with the binder resin, and the number of hollow particles exposed from the surface of the low refractive index layer is likely to be reduced. Therefore, by setting P1/P2 to 4.0 or more, the scratch resistance of the antireflective member can be easily improved.

P1/P2 is more preferably 4.5 or more, and still more preferably 5.0 or more.

The upper limit of P1/P2 is not particularly limited, but is preferably 20.0 or less, more preferably 15.0 or less, and still more preferably 12.0 or less.

Examples of the preferred range of P1/P2 are 4.0 or more and 20.0 or less, 4.0 or more and 15.0 or less, 4.0 or more and 12.0 or less, 4.5 or more and 20.0 or less, 4.5 or more and 15.0 or less, 4.5 or more and 12.0 or less, 5.0 or more and 20.0 or less, 5.0 or more and 15.0 or less, and 5.0 or more and 12.0 or less.

The antireflective member of the present disclosure preferably further satisfies the following condition 3A.
<Condition 3A>

As in the condition 1, after calculating the sum of power spectrum intensities of elevations at all measurement wavelengths, the sum is normalized to 1; and when power spectrum intensity of elevation at a wavelength of 5 um to the sum of power spectrum intensities of elevations normalized to 1 is defined as P3, P3 is 0.050 or less.

Satisfying the condition 3A means that there are few convex portions due to excessively aggregated hollow particles. Therefore, by satisfying the condition 3A, the reflectance can be easily lowered.

P3 is more preferably 0.045 or less, and still more preferably 0.040 or less. The lower limit of P3 is not particularly limited, but is preferably 0.010 or more, more preferably 0.015 or more.

Examples of the preferred ranges of P3 include 0.010 or more and 0.050 or less, 0.010 or more and 0.045 or less, 0.010 or more and 0.040 or less, 0.015 or more and 0.050 or less, 0.015 or more and 0.045 or less, and 0.015 or more and 0.040 or less.

For the same reason as the condition 3A above, the antireflective member preferably satisfies the following conditions 3B and 3C.
<Condition 3B>

As in the condition 1, after calculating the sum of power spectrum intensities of elevations at all measurement wavelengths, the sum is normalized to 1; and when power spectrum intensity of elevation at a wavelength of 2.5 μm to the sum of power spectrum intensities of elevations normalized to 1 is defined as P4, P4 is 0.050 or less.
<Condition 3C>

As in the condition 1, after calculating the sum of power spectrum intensities of elevations at all measurement wavelengths, the sum is normalized to 1; and when power spectrum intensity of elevation at a wavelength of 1.67 μm to the sum of power spectrum intensities of elevations normalized to 1 is defined as P5, P5 is 0.050 or less.

The preferred range of P4 for the condition 3B and the preferred range of P5 for the condition 3C are the same as the preferred range of P3 for the condition 3A.

Actually, more precisely speaking, "1.67 μm" in the condition 3C is "5/3 [μm] (1.666 [μm])."

Calculation Method for Power Spectrum Intensity of Elevation A method of calculating power spectrum intensity of elevation for each wavelength will be described below.

First, as described above, in the present specification, "elevation of the surface on the low refractive index layer side" means the linear distance in the direction of the normal V of the antireflective member between any point P on the surface of the antireflective member on the side having the low refractive index layer with respect to the optically transmissive substrate and a virtual plane M having an average height of the surface (see FIG. 5). The elevation of the virtual plane M is set to 0 μm as a reference. The direction of the normal V is the normal direction of the virtual plane M.

When the orthogonal coordinates in the surface of the antireflective member on the low refractive index layer side are represented by (x, y), the elevation of the surface of the antireflective member on the low refractive index layer side can be represented by a two-dimensional function h(x, y) of the coordinates (x, y).

The elevation of the surface on the low refractive index layer side is preferably measured using an atomic force microscope (AFM). Examples of the AFM include an atomic force microscope "trade name: NanoScope V" manufactured by Bruker Corporation.

The resolution required for the measuring instrument is preferably 0.01 μm or less, more preferably 0.005 μm or less in both the horizontal direction and the vertical direction.

The measurement area for elevation is 5 μm×5 μm.

Next, a method for obtaining the amplitude spectrum of elevation from the two-dimensional function h(x, y). First, from the two-dimensional function h(x, y), the two-dimensional function H(fx, fy) is obtained by Fourier transform defined by the following formula (1).

< Formula (1) >

$$H(f_x, f_y) \equiv \int\limits_{-\infty}^{\infty} \int\limits_{-\infty}^{\infty} h(x, y)\exp[-2\pi i(f_x x + f_y y)]dxdy \qquad \text{[Expression 1]}$$

where fx and fy are the frequencies in the x and y directions, respectively, and have the dimensions of the inverse of the length. π in the formula (1) is the pi, and i is the imaginary unit. A two-dimensional power spectrum H2(fx, fy) can be obtained by squaring the obtained two-dimensional function H(fx, fy). This two-dimensional power spectrum H2(fx, fy) represents the spatial frequency distribution of the surface of the antireflective member on the low refractive index layer side. Spatial frequency is the reciprocal of wavelength.

Hereinafter, the method for obtaining the amplitude spectrum H(f) of the elevation of the surface of the antireflective member on the low refractive index layer side will be described more specifically. The three-dimensional information of the surface shape actually measured by the above AFM is generally obtained as discrete values. That is, the three-dimensional information of the surface shape actually measured by the above AFM is obtained as elevations corresponding to many measurement points.

FIG. 6 is a schematic view showing how the function h(x, y) representing elevation is discretely obtained. As shown in FIG. 6, when the orthogonal coordinates in the plane of the surface on the low refractive index layer side are represented by (x, y) and the lines divided by Δx in the x-axis direction and the lines divided by Δy in the y-axis direction on the projection plane Sp are represented by broken lines, the elevation of the surface on the low refractive index layer side is obtained as a discrete elevation value at each intersection of the broken lines on the projection plane Sp in actual measurement.

The number of elevation values obtained depends on the measurement range and Δx and Δy. As shown in FIG. 6, when the measurement range in the x-axis direction is X=(M−1)Δx and the measurement range in the y-axis direction is Y=(N−1)Δy, the number of obtained elevation values is M×N.

As shown in FIG. 6, when the coordinates of the point of interest A on the projection plane Sp are (jΔx, kΔy), the elevation of the point P on the surface on the low refractive index layer side corresponding to the point of interest A can be represented by h(jΔx, kΔy). Here, j is 0 or more and M−1 or less, and k is 0 or more and N−1 or less.

Here, the measurement intervals Δx and Δy depend on the horizontal resolution of the measuring instrument, and in order to accurately evaluate the fine uneven surface, and as described above, both Δx and Δy are preferably 0.01 µm or less, more preferably 0.005 µm or less.

The measurement ranges X and Y are both 5 µm as described above.

Thus, in actual measurement, the function representing the elevation of the surface on the low refractive index layer side is obtained as a discrete function h(x,y) having M×N values. The discrete function H(fx, fy) is obtained by subjecting the discrete function h(x, y) obtained by the measurement to discrete Fourier transformation defined by the following formula (2), and the discrete function $H^2$(fx, fy) of the two-dimensional power spectrum is obtained by squaring the discrete function H(fx, fy). In the present disclosure, M=N and Δx=Δy. In the following formula (2), "l" is an integer of −M/2 or more and M/2 or less, and "m" is an integer of −N/2 or more and N/2 or less. Δfx and Δfy are frequency intervals in the x direction and the y direction, respectively, and are defined by the formulas (3) and (4) below.

< Formula (2) >

[Expression 2]

$$H(f_x, f_y) = H(l\Delta f_x, m\Delta f_y) \equiv \frac{1}{\sqrt{MN}} \sum_{j=0}^{M-1} \sum_{k=0}^{N-1} h(j\Delta x, k\Delta y)\exp[-2\pi i(jl\Delta x\Delta f_x + km\Delta y\Delta f_y)]$$

< Formula (3) >

$$\Delta f_x \equiv \frac{1}{M\Delta x} \quad (3)$$

< Formula (4) >

$$\Delta f_y \equiv \frac{1}{N\Delta y} \quad (4)$$

The discrete function $H^2$(fx, fy) of the two-dimensional power spectrum calculated as described above represents the spatial frequency distribution of the uneven surface of the antireflective member. The reciprocal of the spatial frequency can be converted into a wavelength.

FIGS. 8 to 15 show a ratio of power spectrum intensity of elevation at each wavelength to the sum of power spectrum intensities of elevations at all measurement wavelengths with respect to the antireflective member of Examples 1 to 4 and Comparative Examples 1 to 4, provided that the sum is normalized to 1. In FIGS. 8 to 15, the horizontal axis represents the wavelength (unit: µm), and the vertical axis represents the ratio of power spectrum intensity of each wavelength to the sum (unit: non-dimensional).

<Low Refractive Index Layer>

The low refractive index layer contains at least a binder resin and hollow particles.

The low refractive index layer is preferably located on the outermost surface of the antireflective member on the side having the low refractive index layer with respect to the optically transmissive substrate.

Although the antireflective member of the present disclosure contains hollow particles having low strength in the low refractive index layer, the antireflective member satisfies the condition 1, and therefore, can improve scratch resistance.

Means of readily satisfying the condition 1 include the following (a) to (g). By appropriately combining these means, an antireflective member satisfying the condition 1 can be easily obtained.

(a) The surface of the hollow particles is treated with methacryloyl groups.

(b) The content of the solid particles with respect to the hollow particles is set to a certain level or more.

(c) A solvent having a low evaporation rate is used as the solvent.

(d) The wettability between the low refractive index layer and the lower layer of the low refractive index layer is improved.

(e) The content of the hollow particles with respect to the binder resin is set to a certain value or more.

(f) Initial drying is slowed.

(g) The ratio of the acrylate resin component in the binder resin is set to a certain value or more.

<<Binder Resin>>

The low refractive index layer preferably contains a cured product of a curable resin composition as the binder resin. The ratio of the cured product of the curable resin composition based on the total binder resin in the low refractive index layer is preferably 50% by mass or more, more preferably 70% by mass or more, more preferably 90% by mass or more, and most preferably 100% by mass.

Examples of the curable resin composition for the low refractive index layer include thermosetting resin compositions and ionizing radiation-curable resin compositions, and ionizing radiation-curable resin compositions are preferred. That is, the low refractive index layer preferably contains a cured product of an ionizing radiation-curable resin composition as a binder resin.

The thermosetting resin composition is a composition containing at least a thermosetting resin, and is a resin composition that is cured by heating.

Examples of thermosetting resins include acrylic resins, urethane resins, phenol resins, urea melamine resins, epoxy resins, unsaturated polyester resins, and silicone resins. If necessary, a curing agent is added to these curable resins in the thermosetting resin composition.

The ionizing radiation-curable resin composition is a composition containing a compound having an ionizing radiation-curable functional group (hereinafter also referred to as an "ionizing radiation-curable compound"). Examples of the ionizing radiation-curable functional group include ethylenically unsaturated bond groups such as a (meth) acryloyl group, a vinyl group, an allyl group, an epoxy group, and an oxetanyl group. The ionizing radiation-curable compound preferably has two or more ionizing radiation-curable functional groups.

The ionizing radiation-curable compound is preferably a compound having an ethylenically unsaturated bond group, and in particular, a (meth)acrylate-based compound having a (meth)acryloyl group is more preferable.

Hereinafter, a (meth)acrylate-based compound having four or more ethylenically unsaturated bond groups is referred to as "polyfunctional (meth)acrylate-based compound." A (meth)acrylate-based compound having two or more and three or less ethylenically unsaturated bond groups is referred to as "low functional (meth)acrylate-based compound."

Both monomers and oligomers can be used as the (meth) acrylate-based compound.

From the viewpoint of easily satisfying the condition 1, the content of the cured product of the (meth)acrylate-based compound is preferably 50% by mass or more, and more preferably 70% by mass or more, based on the total amount of the binder resin. The (meth)acrylate compound is preferably an acrylate compound.

Examples of the bifunctional (meth)acrylate-based compound as the (meth)acrylate-based compound include di(meth)acrylate isocyanurate, polyalkylene glycol di(meth) acrylate such as ethylene glycol di(meth)acrylate, polyethylene glycol diacrylate, and polybutylene glycol di(meth) acrylate, bisphenol A tetraethoxy diacrylate, bisphenol A tetrapropoxy diacrylate, and 1,6-hexanediol diacrylate.

Examples of the trifunctional (meth)acrylate-based compound include trimethylolpropane tri(meth)acrylate, pentaerythritol tri(meth)acrylate, and isocyanuric acid-modified tri(meth)acrylate.

Examples of the tetrafunctional or higher functional multifunctional (meth)acrylate-based compound include pentaerythritol tetra(meth)acrylate, clipentaerythritol hexa(meth)acrylate, and dipentaerythritol tetra(meth)acrylate.

These (meth)acrylate-based compounds may be modified as described later.

Examples of the (meth)acrylate-based oligomer include an acrylate-based polymer such as urethane (meth)acrylate, epoxy (meth)acrylate, polyester (meth)acrylate, and polyether (meth)acrylate.

The urethane (meth)acrylate is obtained, for example, by reacting a polyhydric alcohol and an organic diisocyanate with hydroxy (meth)acrylate.

Preferred examples of the epoxy (meth)acrylate include a (meth)acrylate obtained by reacting a trifunctional or higher functional aromatic epoxy resin, alicyclic epoxy resin, aliphatic epoxy resin or the like with a (meth)acrylic acid, a (meth)acrylate obtained by reacting a bifunctional or higher functional aromatic epoxy resin, alicyclic epoxy resin, aliphatic epoxy resin or the like with a polybasic acid and a (meth)acrylic acid, and a (meth)acrylate obtained by reacting a bifunctional or higher functional aromatic epoxy resin, alicyclic epoxy resin, aliphatic epoxy resin or the like with a phenol compound and a (meth)acrylic acid.

The (meth)acrylate-based compound may have a modified partial molecular structure from the viewpoint of suppressing the variation in shrinkage by crosslinking. For example, such a compound modified with ethylene oxide, propylene oxide, caprolactone, isocyanuric acid, alkyl, cyclic alkyl, aromatic, bisphenol, or the like can also be used.

The ionizing radiation-curable resins may be used singly or in combination of two or more.

In a case where the ionizing radiation-curable resin is an ultraviolet ray-curable resin, a coating solution for forming a low refractive index layer preferably includes an additive such as a photopolymerization initiator and a photopolymerization accelerator.

Examples of the photopolymerization initiator include at least one selected from acetophenone, benzophenone, α-hydroxyalkylphenone, Michler's ketone, benzoin, benzildimethylketal, benzoyl benzoate, α-acyloxime ester, α-aminoalkylphenone, and a thioxanthone compound.

The photopolymerization accelerator may enhance the curing rate through the reduction of polymerization inhibition due to the air on curing, and examples thereof include at least one selected from isoamyl p-dimethylaminobenzoate and ethyl p-dimethylaminobenzoate.

<<Hollow Particles>>

The hollow particles refer to particles which each have an outer shell layer, have a hollow thereinside, surrounded by the outer shell layer, and include air in the hollow. The hollow particles are particles which each include air to thereby have a lowered refractive index proportional to the occupancy of the gas, as compared with the refractive index of the outer shell layer.

The material of the outer shell layer of the hollow particles may be an inorganic compound such as silica, magnesium fluoride, or an organic compound, but silica is preferable from the viewpoint of lowering the refractive index and strength. That is, the low refractive index layer preferably contains hollow silica particles as hollow particles.

Considering optical properties and mechanical strength, the lower limit of the average primary particle size of the hollow particles is preferably 50 nm or more, more preferably 65 nm or more, and the upper limit is preferably 100 nm or less, more preferably 80 nm or less.

Examples of the preferred range of the average primary particle size of the hollow particles include 50 nm or more and 100 nm or less, 50 nm or more and 80 nm or less, 65 nm or more and 100 nm or less, and 65 nm or more and 80 nm or less.

The average primary particle size of hollow particles, solid particles described later, and high refractive particles described later can be calculated by the following operations (A1) to (A3).

(A1) A cross-section of the antireflective member is imaged with a TEM or STEM. The acceleration voltage of the TEM or STEM is preferably 10 kV or more and 30 kV or less, and the magnification is preferably 50,000 times or more and 300,000 times or less.

(A2) Any 10 particles are extracted from the observed image and the particle size of each particle is calculated. The particle size is measured as the linear distance in a combination of two straight lines such that the linear distance between the two straight lines is maximum when the cross-section of the particle is sandwiched between two arbitrary parallel straight lines.

(A3) The same operation is performed five times on an observation image of another screen of the same sample, and a value obtained from the number average of the particle size of 50 particles in total is defined as the average primary particle size of the particles.

The lower limit of the porosity of the hollow particles is preferably 5% or more, more preferably 10% or more, and still more preferably 20% or more from the viewpoint of lowering the refractive index, and the upper limit is preferably 80% or less, more preferably 70% or less, and still more preferably 60% or less from the viewpoint of strength.

The porosity of hollow particle can be calculated by measuring the diameter of the hollow particle and the thickness of the outer shell portion excluding the void portion by cross-sectional STEM observation or the like of the hollow particle, and calculating the volume of the void portion of the hollow particle assuming that the hollow particle is a sphere and the volume of the hollow particle assuming that there is no void portion, and using the formula: {(volume of void portion of the hollow particle)/ (volume of the hollow particle assuming that there is no void portion)}×100.

Examples of the preferred range of the porosity of the hollow particles include 5% or more and 80% or less, 5% or more and 70% or less, 5% or more and 60% or less, 10% or more and 80% or less, 10% or more and 70% or less, 10% or more and 60% or less, 20% or more and 80% or less, 20% or more and 70% or less, and 20% or more and 60% or less.

As the content of hollow particles increases, the refractive index of the low refractive index layer decreases. Therefore, the content of the hollow particles is preferably 100 parts by mass or more, more preferably 150 parts by mass or more, and still more preferably 175 parts by mass or more, based on 100 parts by mass of the binder resin. Furthermore, by increasing the content of the hollow particles, the hollow particles are easily aggregated, and thus the condition 1 can be easily satisfied.

On the other hand, when the content of the hollow particles with respect to the binder resin is too large, the hollow particles are easily exposed from the binder resin, and the amount of the binder resin binding the hollow particles decreases, and thus the mechanical strength such as scratch resistance of the low refractive index layer tends to decrease. Therefore, the content of the hollow particles is preferably 400 parts by mass or less, more preferably 300 parts by mass or less, and still more preferably 250 parts by mass or less, based on 100 parts by mass of the binder resin.

Examples of the preferred range of the content of the hollow particles based on 100 parts by mass of the binder resin include 100 parts by mass or more and 400 parts by mass or less, 100 parts by mass or more and 300 parts by mass or less, 100 parts by mass or more and 250 parts by mass or less, 150 parts by mass or more and 400 parts by mass or less, 150 parts by mass or more and 300 parts by mass or less, 150 parts by mass or more and 250 parts by mass or less, 175 parts by mass or more and 400 parts by mass or less, 175 parts by mass or more and 300 parts by mass or less, and 175 parts by mass or more and 250 parts by mass or less.

The hollow particles preferably have surfaces coated with a silane coupling agent. The silane coupling agent preferably has a (meth)acryloyl group or an epoxy group, and more preferably has a methacryloyl group.

By subjecting the hollow particles to a surface treatment with a silane coupling agent, the affinity between the hollow particles and the binder resin is improved, and excessive aggregation of the hollow particles can be easily suppressed. The surface of the solid particles described later is also preferably coated with a silane coupling agent in order to suppress excessive aggregation.

<<Solid Particles>>

The low refractive index layer preferably contains solid particles from the viewpoint of improving scratch resistance.

The material of the solid particles is preferably inorganic compounds such as silica and magnesium fluoride, and more preferably silica.

The average primary particle size of the solid particles is preferably smaller than the average primary particle size of the hollow particles. The lower limit of the average primary particle size of the solid particles is preferably 5 nm or more, more preferably 10 nm or more, and the upper limit is preferably 20 nm or less, more preferably 15 nm or less.

Examples of the preferred range of the average primary particle size of the solid particles include 5 nm or more and 20 nm or less, 5 nm or more and 15 nm or less, 10 nm or more and 20 nm or less, and 10 nm or more and 15 nm or less.

The content of the solid particles is preferably 10 parts by mass or more, more preferably 50 parts by mass or more, more preferably 70 parts by mass or more, and more preferably 100 parts by mass or more, based on 100 parts by mass of the binder resin, from the viewpoint of further improving the scratch resistance.

On the other hand, when the content of the solid particles is too large, the solid particles are easily aggregated, and the amount of the binder resin covering the hollow particles decreases, which may reduce the scratch resistance. Therefore, the content of the solid particles is preferably 200 parts by mass or less, more preferably 150 parts by mass or less, based on 100 parts by mass of the binder resin.

Examples of the preferred range of the content of the solid particles based on 100 parts by mass of the binder resin include 10 parts by mass or more and 200 parts by mass or less, 10 parts by mass or more and 150 parts by mass or less, 50 parts by mass or more and 200 parts by mass or less, 50 parts by mass or more and 150 parts by mass or less, 70 parts by mass or more and 200 parts by mass or less, 70 parts by mass or more and 150 parts by mass or less, 100 parts by mass or more and 200 parts by mass or less, and 100 parts by mass or more and 150 parts by mass or less.

The content of the solid particles is preferably 30 parts by mass or more, preferably 40 parts by mass or more, based on 100 parts by mass of the hollow particles. By containing the solid particles in the above range with respect to the hollow particles, the hollow particles become less likely to flow, and the hollow particles are easily aggregated, and thus the condition 1 can be easily satisfied.

When the content of solid particles with respect to the hollow particles is too large, the reflectance tends to increase. Therefore, the content of the solid particles is preferably 80 parts by mass or less, more preferably 70 parts by mass or less, based on 100 parts by mass of the hollow particles.

Examples of the preferred range of the content of the solid particles based on 100 parts by mass of the hollow particles include 30 parts by mass or more and 80 parts by mass or less, 30 parts by mass or more and 70 parts by mass or less, 40 parts by mass or more and 80 parts by mass or less, and 40 parts by mass and 70 parts by mass or less.

The lower limit of the refractive index of the low refractive index layer is preferably 1.10 or more, more preferably 1.20 or more, more preferably 1.26 or more, more preferably 1.28 or more, and more preferably 1.30 or more, and the upper limit thereof is preferably 1.48 or less, more preferably 1.45 or less, more preferably 1.40 or less, more preferably 1.38 or less, and more preferably 1.35 or less.

In the present specification, the refractive index of the layers constituting the antireflective layer, such as the low refractive index layer and the high refractive index layer, means the value at the wavelength of 589.3 nm.

Examples of the preferred range of the refractive index of the low refractive index layer include 1.10 or more and 1.48 or less, 1.10 or more and 1.45 or less, 1.10 or more and 1.40 or less, 1.10 or more and 1.38 or less, 1.10 or more and 1.35 or less, 1.20 or more and 1.48 or less, 1.20 or more and 1.45 or less, 1.20 or more and 1.40 or less, 1.20 or more and 1.38 or less, 1.20 or more and 1.35 or less, 1.26 or more and 1.48 or less, 1.26 or more and 1.45 or less, 1.26 or more and 1.40 or less, 1.26 or more and 1.38 or less, 1.26 or more and 1.35 or less, 1.28 or more and 1.48 or less, 1.28 or more and 1.45 or less, 1.28 or more and 1.40 or less, 1.28 or more and 1.38 or less, 1.28 or more and 1.35 or less, 1.30 or more and 1.48 or less, 1.30 or more and 1.45 or less, 1.30 or more and 1.40 or less, 1.30 or more and 1.38 or less, and 1.30 or more and 1.35 or less.

The lower limit of the thickness of the low refractive index layer is preferably 80 nm or more, more preferably 85 nm or more, more preferably 90 nm or more, and the upper limit thereof is 150 nm or less, more preferably 110 nm or less, and more preferably 105 nm or less.

Examples of the preferred range of the thickness of the low refractive index layer include 80 nm or more and 150 nm or less, 80 nm or more and 110 nm or less, 80 nm or more and 105 nm or less, 85 nm or more and 150 nm or less, 85 nm or more and 110 nm or less, 85 nm or more and 105 nm or less, 90 nm or more and 150 nm or less, 90 nm or more and 110 nm or less, and 90 nm or more and 105 nm or less.

The low refractive index layer may further contain additives such as a leveling agent, an anti-static agent, an antioxidant, a surfactant, a dispersant, and an ultraviolet absorber.

In particular, when the low refractive index layer contains a leveling agent such as a fluorine leveling agent and a silicone leveling agent, the surface lubricity of the low refractive index layer is enhanced, and scratch resistance can be further easily improved. The content of the leveling agent is preferably 0.1 parts by mass or more and 20 parts by mass or less, more preferably 1 part by mass or more and 15 parts by mass or less, based on 100 parts by mass of the binder resin of the low refractive index layer. The content of the leveling agent may be 0.1 parts by mass or more and 15 parts by mass or less or 1 part by mass or more and 20 parts by mass or less, based on 100 parts by mass of the binder resin of the low refractive index layer.

The low refractive index layer can be formed by applying and drying a coating solution for a low refractive index layer containing components and solvents constituting the low refractive index layer, and curing by irradiation with ionizing radiation as necessary.

<<Solvent>>

Examples of the solvent include ketones such as acetone, methyl ethyl ketone, methyl isobutyl ketone (MIBK), and cyclohexanone; ethers such as dioxane and tetrahydrofuran; aliphatic hydrocarbons such as hexane; alicyclic hydrocarbons such as cyclohexane; aromatic hydrocarbons such as toluene and xylene; halogenated carbons such as dichloromethane and dichloroethane; esters such as methyl acetate, ethyl acetate, and butyl acetate; alcohols such as isopropanol, butanol, and cyclohexanol; cellosolves such as methyl cellosolve and ethyl cellosolve; glycol ethers such as propylene glycol monomethyl ether acetate; cellosolve acetates; sulfoxides such as dimethyl sulfoxide; amides such as dimethylformamide and dimethylacetamide; and a mixture of these.

The solvent for the low refractive index layer preferably contains a solvent that evaporates slowly. By containing a solvent having a slow evaporation rate, the hollow particles can be aggregated, and thus the condition 1 can be easily satisfied.

In the present specification, a solvent having a low evaporation rate means a solvent having an evaporation rate of less than 100 when the evaporation rate of butyl acetate is 100. The evaporation rate of the solvent having a slow evaporation rate is preferably 20 or more and 60 or less, and more preferably 40 or more and 50 or less.

Examples of solvents having a low evaporation rate include cyclohexanone having an evaporation rate of 32 and 1-methoxy-2-propyl acetate having an evaporation rate of 44.

The content of the solvent having a slow evaporation rate is preferably 20% by mass or more, more preferably 25% by mass or more, based on the total amount of the solvent in the low refractive index layer.

On the other hand, when the content of the solvent having a slow evaporation rate is too large, the hollow particles tend to aggregate excessively and the reflectance tends to increase. Therefore, it is preferable to use a combination of a solvent having a slow evaporation rate and a solvent having a high evaporation rate as the solvent for the low refractive index layer.

In the present specification, a solvent having a high evaporation rate means a solvent having an evaporation rate of 100 or more when the evaporation rate of butyl acetate is 100. The evaporation rate of the solvent having a high evaporation rate is preferably 120 or more and 300 or less, more preferably 130 or more and 180 or less.

Examples of solvents having a high evaporation rate include methyl isobutyl ketone having an evaporation rate of 160, toluene having an evaporation rate of 200, and methyl ethyl ketone having an evaporation rate of 370.

The mass ratio of the solvent having a high evaporation rate and the solvent having a low evaporation rate is preferably 50:50 to 80:20, more preferably 60:40 to 75:25.

<<Drying Conditions>>

The drying temperature of the coating solution for a low refractive index layer is preferably 45° C. or higher and 60° C. or lower, and more preferably 47° C. or higher and 53° C. or lower. By drying at a relatively low temperature in this manner, the hollow particles are easily aggregated, and thus the condition 1 can be easily satisfied.

The wind speed of the drying air for the coating solution for a low refractive index layer is preferably 0.1 m/s or more and 10 m/s or less, more preferably 0.3 m/s or more and 7 m/s or less.

The coating solution for a low refractive index layer may be dried in two stages. Examples of the two stage drying include the following (1) and (2), and a combination thereof. Drying in two stages delays the initial drying of the low refractive index layer, making it easier for the hollow particles to aggregate, and thus the condition 1 can be easily satisfied. The drying temperature in the following (1) and (2) is preferably within the above temperature range. (1) The wind speed of the drying air is changed between the first stage drying and the second stage drying. Preferably, "wind speed in the first stage <wind speed in the second stage". (2) The drying temperature is changed between the first stage drying and the second stage drying. Preferably, "drying temperature in the first stage <drying temperature in the second stage".

<Other Layers>

The antireflective member preferably possesses one or more layers between the optically transmissive substrate and the low refractive index layer selected from the group consisting of a hardcoat layer and a high refractive index layer, and more preferably has both the hardcoat layer and the high refractive index layer. By having the hardcoat layer, the scratch resistance of the antireflective member can be easily improved. By having the high refractive index layer, the reflectance of the antireflective member can be easily reduced.

When the antireflective member has both the hardcoat layer and the high refractive index layer between the optically transmissive substrate and the low refractive index layer, the antireflective member preferably includes the optically transmissive substrate, the hardcoat layer, the high refractive index layer, and the low refractive index layer in this order.

<<Hardcoat Layer>>

The hardcoat layer preferably contains, as a main component, a cured product of a curable resin composition such as a thermosetting resin composition or an ionizing radiation-curable resin composition. The main component means 50% by mass or more, preferably 70% by mass or more, more preferably 90% by mass or more, of the resin component constituting the hardcoat layer.

Examples of the curable resin composition such as a thermosetting resin composition or an ionizing radiation-curable resin composition include those exemplified for the low refractive index layer.

The lower limit of the thickness of the hardcoat layer is preferably 0.5 μm or more, more preferably 1 μm or more, and the upper limit is preferably 30 μm or less, more preferably 10 μm or less. By setting the thickness of the hardcoat layer within the above range, the occurrence of cracks during processing such as cutting can be easily suppressed while improving the scratch resistance.

Examples of the preferred range of the thickness of the hardcoat layer include 0.5 μm or more and 30 μm or less, 0.5 μm or more and 10 μm or less, 1 μm or more and 30 μm or less, and 1 μm or more and 10 μm or less.

The hardcoat layer may further contain additives such as a leveling agent, an anti-static agent, an antioxidant, a surfactant, a dispersant, and an ultraviolet absorber.

<<High Refractive Index Layer>>

The high refractive index layer can be formed, for example, from a coating solution for forming a high refractive index layer containing a binder resin composition and high refractive index particles. That is, the high refractive index layer preferably contains a binder resin and high refractive index particles.

The high refractive index layer preferably contains a cured product of a curable resin composition as the binder resin. The ratio of the cured product of the curable resin composition based on the total binder resin in the high refractive index layer is preferably 50% by mass or more, more preferably 70% by mass or more, more preferably 90% by mass or more, and most preferably 100% by mass.

Examples of the curable resin composition for the high refractive index layer include thermosetting resin compositions and ionizing radiation-curable resin compositions. Examples of the curable resin composition such as a thermosetting resin composition or an ionizing radiation-curable resin composition include those exemplified for the low refractive index layer.

Examples of the high refractive index particles include antimony pentoxide (1.79), zinc oxide (1.90), titanium oxide (2.3 or more and 2.7 or less), cerium oxide (1.95), tin-doped indium oxide (1.95 or more and 2.00 or less), antimony-doped tin oxide (1.75 or more and 1.85 or less), yttrium oxide (1.87), and zirconium oxide (2.10). The numbers in parentheses are the refractive index of each high refractive index particle.

The average primary particle size of the high refractive index particles is preferably 2 nm or more, more preferably 5 nm or more, and still more preferably 10 nm or more. The average primary particle size of the high refractive index particles is preferably 200 nm or less, more preferably 100 nm or less, more preferably 80 nm or less, more preferably 60 nm or less, and more preferably 30 nm or less, from the viewpoint of suppressing whitening and transparency.

Examples of the preferred range of the average primary particle size of the high refractive index particles include 2 nm or more and 200 nm or less, 2 nm or more and 100 nm or less, 2 nm or more and 80 nm or less, 2 nm or more and 60 nm or less, 2 nm or more and 30 nm or less, 5 nm or more and 200 nm or less, 5 nm or more and 100 nm, 5 nm or more and 80 nm or less, 5 nm or more and 60 nm or less, 5 nm or more and 30 nm or less, 10 nm or more and 200 nm or less, 10 nm or more and 100 nm or less, 10 nm or more and 80 nm or less, 10 nm or more and 60 nm or less, and 10 nm or more and 30 nm or less.

The lower limit of the content of the high refractive index particles is preferably 100 parts by mass or more, more preferably 150 parts by mass or more, and still more preferably 250 parts by mass or more, and the upper limit thereof is preferably 500 parts by mass or less, more preferably 400 parts by mass or less, and still more preferably 350 parts by mass or less, based on 100 parts by mass of the binder resin.

Examples of the preferred range of the content of the high refractive index particle based on 100 parts by mass of the binder resin include 100 parts by mass or more and 500 parts by mass or less, 100 parts by mass or more and 400 parts by mass or less, 100 parts by mass or more and 350 parts by mass or less, 150 parts by mass or more and 500 parts by mass or less, 150 parts by mass or more and 400 parts by mass or less, 150 parts by mass or more and 350 parts by mass or less, 250 parts by mass or more and 500 parts by mass or less, 250 parts by mass or more and 400 parts by mass or less, and 250 parts by mass or more and 350 parts by mass or less.

The lower limit of the refractive index of the high refractive index layer is preferably 1.53 or more, more preferably 1.54 or more, more preferably 1.55 or more, more preferably 1.56 or more, and the upper limit thereof is preferably 1.85 or less, more preferably 1.80 or less, more preferably 1.75 or less, more preferably 1.70 or less.

Examples of the preferred range of the refractive index of the high refractive index layer include 1.53 or more and 1.85 or less, 1.53 or more and 1.80 or less, 1.53 or more and 1.75 or less, 1.53 or more and 1.70 or less, 1.54 or more and 1.85 or less, 1.54 or more and 1.80 or less, 1.54 or more and 1.75 or less, 1.54 or more and 1.70 or less, 1.55 or more and 1.85 or less, 1.55 or more and 1.80 or less, 1.55 or more and 1.75 or less, 1.55 or more and 1.70 or less, 1.56 or more and 1.85 or less, 1.56 or more and 1.80 or less, 1.56 or more and 1.75 or less, and 1.56 or more and 1.70 or less.

The upper limit of the thickness of the high refractive index layer is preferably 200 nm or less, more preferably 180 nm or less, still more preferably 150 nm or less, and the lower limit is preferably 50 nm or more, more preferably 70 nm or more.

Examples of the preferred range of the thickness of the high refractive index layer include 50 nm or more and 200 nm or less, 50 nm or more and 180 nm or less, 50 nm or more and 150 nm or less, 70 nm or more and 200 nm or less, 70 nm or more and 180 nm or less, and 70 nm or more and 150 nm or less.

The high refractive index layer may further contain additives such as a leveling agent, an anti-static agent, an antioxidant, a surfactant, a dispersant, and an ultraviolet absorber.

The content of the leveling agent in the high refractive index layer is preferably 3 parts by mass or less, more preferably 1 part by mass or less, based on 100 parts by mass of the binder resin, from the viewpoint of improving the wettability of the low refractive index layer.

The antireflective member may further have a layer other than the layers described above, such as an anti-fouling layer and an anti-static layer.

<Optical Characteristics>

The antireflective member preferably has a total optical transmittance of 70% or more, more preferably 80% or more, and still more preferably 85% or more, in accordance with JIS K7361-1:1997.

The light incident surface for measuring total optical transmittance and haze, which will be described later, is the opposite side to the surface on the low refractive index layer side.

The antireflective member preferably has a haze of 1.0% or less, more preferably 0.7% or less, and still more preferably 0.5% or less, in accordance with JIS K7136:2000. By setting the haze to 1.0% or less, the image resolution can be easily improved. The lower limit value of haze is not particularly limited, but is usually 0.1% or more.

Examples of the preferred range of the haze of the antireflective member include 0.1% or more and 1.0% or less, 0.1% or more and 0.7% or less, and 0.1% or more and 0.5% or less.

The antireflective member has a luminous reflectance Y value of preferably 1.0% or less, more preferably 0.7% or less, and still more preferably 0.5% or less, the luminous reflectance Y value being measured at an incident angle of light of 5 degrees from the side having the low refractive index layer with respect to the optically transmissive substrate. The lower limit value of the luminous reflectance Y value is not particularly limited, but is usually 0.1% or more.

Examples of the preferred range of the luminous reflectance Y value of the antireflective member include 0.1% or more and 1.0% or less, 0.1% or more and 0.7% or less, and 0.1% or more and 0.5% or less.

When measuring the luminous reflectance Y value, a black plate is adhered to the surface of the antireflective member on the optically transmissive substrate side via a transparent adhesive layer to produce a sample, and the measurement is carried out by causing light incident from the low refractive index layer side of the sample at an incident angle of 5°. The light source condition for calculating the reflectance is preferably a C light source.

The difference in refractive index between the member in contact with transparent pressure-sensitive adhesive layer (for example, optically transmissive substrate) of sample and the transparent adhesive layer is preferably 0.15 or less, more preferably 0.10 or less, and still more preferably 0.05 or less. The black plate preferably has a total optical transmittance of 1% or less, more preferably 0%, in accordance with JIS K7361-1:1997. The difference in refractive index between the resin constituting the black plate and the refractive index of the transparent adhesive layer is preferably 0.15 or less, more preferably 0.10 or less, and still more preferably 0.05 or less.

<Steel Wool Resistance>

The steel wool resistance of the antireflective member of the surface on the low refractive index layer side is preferably 750 g or more, more preferably 900 g or more, still more preferably 1000 g or more, and further preferably 1200 g or more, under illumination of fluorescent lamp. The upper limit of steel wool resistance is not particularly limited, but is about 2000 g or less.

Examples of the preferred range of the steel wool resistance of the antireflective member include 750 g or more and 2000 g or less, 900 g or more and 2000 g or less, 1000 g or more and 2000 g or less, and 1200 g or more and 2000 g or less.

The steel wool resistance in the present disclosure is obtained by rubbing the surface of the antireflective member on the low refractive index layer side with steel wool under loading in the following conditions, thereafter performing observation with change in angle between a fluorescent lamp and an antireflective member, and determining a maximum load when no scratches are observed with the naked eye and the number of scratches is 0. Each observation is performed under the illumination of a fluorescent lamp with an illuminance of 200 Lx or more and 2000 Lx or less, and the distance from the light emitting portion of the fluorescent lamp to the antireflective member is 10 cm or more and 300 cm or less. Examples of the fluorescent lamp used for observation include a three-wavelength fluorescent lamp (model number: FHF32EX-N-H) manufactured by Panasonic Corporation.

The area of the steel wool contacted with the surface of the antireflective member on the low refractive index layer side is in a range of from 0.5 cm2 or more and 5.0 cm2 or less. The shape of a surface on which the steel wool and the low refractive index layer of the antireflective member are contacted may be, for example, a round shape, a triangular shape, or a polygonal shape, and is preferably a circular shape. The steel wool is moved at a one-way moving distance of 30 mm or more in the same place in a test (moving distance per stroke: 60 mm or more). The one-way moving distance is appropriately set depending on the size of a device to which the antireflective member is applied.

<Test Conditions>

Steel wool: product name: Bonstar, item number: #0000, manufactured by Nihon Steel Wool Co., Ltd.

Moving speed: 100 mm/sec

Number of strokes: 10

<Surface Shape>

The surface of the antireflective member on the low refractive index layer side has an arithmetic mean roughness Ra of 0.05 μm or less, more preferably 0.03 μm or less, in accordance with JIS B0601:1994 at a cutoff value of 0.8 mm. The lower limit of Ra is not particularly limited, but is preferably 0.005 μm or more.

Examples of the preferred range of Ra include 0.005 μm or more and 0.05 μm or less, and 0.005 μm or more and 0.03 μm or less.

<Size, Shape, and the Like>

The antireflective member may be in the form of a single sheet cut into a predetermined size, or may be in the form of a roll obtained by winding a long sheet. The size of the single sheet is not particularly limited, but the maximum diameter is about 2 inches or more and 500 inches or less. The "maximum diameter" refers to the maximum length of any two points of the antireflective member when connected. For example, when the antireflective member is rectangular, the diagonal line of the rectangle is the maximum diameter. When the antireflective member is circular, the diameter of the circle is the maximum diameter.

The width and length of the roll are not particularly limited, but generally, the width is 500 mm or more and 3000 mm or less and the length is about 500 m or more and 5000 m or less. The antireflective member in the form of a roll may be cut into a single sheet according to the size of an image display device or the like. At the time of cutting, it is preferable to exclude the end portion of the roll where the physical properties are not stable.

The shape of the single sheet is also not particularly limited, and may be, for example, a polygonal shape (triangular shape, quadrangular shape, pentagonal shape, or the like) or a round shape, or may be a randomly irregular shape. More specifically, in a case where the antireflective member has a quadrangular shape, the aspect ratio is not particularly limited as long as it is not problematic in terms of a display screen. For example, the aspect ratio may be horizontal: vertical=1:1, 4:3, 16:10, 16:9, 2:1, or the like, but the aspect ratio is not limited to such an aspect ratio in in-vehicle applications and digital signage which are rich in design. The surface shape of the antireflective member on the side opposite to the uneven surface is not particularly limited, but is preferably substantially smooth. "Substantially smooth" means that the arithmetic mean roughness Ra at a cutoff value of 0.8 mm is less than 0.03 μm, preferably 0.02 μm or less, in accordance with JIS B0601:1994.

Polarizing Plate

The polarizing plate of the present disclosure is a polarizing plate including a polarizer, a first transparent protective plate disposed on one side of the polarizer, and a second transparent protective plate disposed on the other side of the polarizer, wherein any one of the first transparent protective plate and the second transparent protective plate is the antireflective member of the present disclosure described above, and the antireflective member is disposed such that a surface of the antireflective member on the optically transmissive substrate side faces the polarizer side.

The polarizing plate is used, for example, for imparting antireflective properties in combination with a λ/4 phase difference plate. In this case, the λ/4 phase difference plate is disposed on the display element of an image display device, and the polarizing plate is disposed on the viewer side to the λ/4 phase difference plate.

Further, in the case where the polarizing plate is for liquid crystal display devices, it is used for imparting functions of the liquid crystal shutter. In this case, a lower polarizing plate, a liquid crystal display element, and an upper polarizing plate are disposed in this order in the liquid crystal display device, so that the absorption axis of the polarizer of the lower polarizing plate and the absorption axis of the polarizer of the upper polarizing plate are orthogonal to each other. In the above configuration, it is preferable to use the polarizing plate of the present disclosure as the upper polarizing plate.

<Transparent Protective Plate>

The polarizing plate of the present disclosure includes the antireflective member of the present disclosure as at least one of the first transparent protective plate and the second transparent protective plate. In a preferred embodiment, both the first transparent protective plate and the second transparent protective plate include the antireflective member of the present disclosure described above.

When one of the first transparent protective plate and the second transparent protective plate includes the antireflective member of the present disclosure, the other transparent protective plate is not specifically limited but is preferably an optically isotropic transparent protective plate.

In the present specification, the optically isotropy refers to an in-plane phase difference of less than 20 nm, preferably 10 nm or less, more preferably 5 nm or less. Triacetyl cellulose (TAC) films can easily impart optically isotropy.

When one of the first transparent protective plate and the second transparent protective plate includes the antireflective member of the present disclosure, it is preferable that the transparent protective plate on the light-emitting side includes the antireflective member of the present disclosure described above.

<Polarizer>

Examples of the polarizer include a sheet-type polarizer formed by stretching a film stained with iodine or the like, such as polyvinyl alcohol films, polyvinyl formal films, polyvinyl acetal films, and ethylene-vinyl acetate copolymer saponification films; a wire grid polarizer composed of many metal wires aligned in parallel; a coated polarizer coated with lyotropic liquid crystal and dichroic guest-host material; a multilayer thin film-type polarizer, and the like. Such a polarizer may be a reflective polarizer having a function of reflecting polarization components that do not transmit.

The polarizer is preferably disposed such that the direction of the absorption axis and the average direction of the slow axis of the optical plastic film are substantially parallel or substantially perpendicular. Substantially parallel means within 0°±5°, preferably within 0°±3°, more preferably within 0°±1°. Substantially perpendicular means within 90°±5°, preferably within 90°±3°, more preferably within 90°±1°.

Image Display Device

The image display device of the present disclosure includes the aforementioned antireflective member on a display element, wherein the antireflective member is disposed such that a surface of the antireflective member on the low refractive index layer side is disposed so as to face the opposite side to the display element, the antireflective member being disposed on an outermost surface (see FIG. 7).

Examples of display elements include liquid crystal display elements, EL display elements such as organic EL display elements and inorganic EL display elements, plasma display elements, and LED display elements such as micro LED display elements. These display elements may have a touch panel function inside the display element.

Examples of the liquid crystal display method of the liquid crystal display element include an IPS method, a VA method, a multi-domain method, an OCB method, an STN method, and a TSTN method. When the display element is a liquid crystal display element, a backlight is required. The backlight is arranged on the side of the liquid crystal display element opposite to the side where the antireflective member is arranged.

The image display device of the present disclosure may be an image display device with a touch panel having the touch panel between the display element and the antireflective member. In this case, the antireflective member may be disposed on the outermost surface of the image display device with the touch panel, and the surface of the antireflective member on the low refractive index layer side may be disposed so as to face the side opposite to the display element.

The size of the image display device is not particularly limited, but the maximum diameter of the effective display region is about 2 inches or more and 500 inches or less.

The effective display region of an image display device is an area in which an image can be displayed. For example, when the image display device has a housing that surrounds the display element, the region inside the housing becomes the effective display region.

The maximum diameter of the effective display region refers to the maximum length of any two points within the effective display region when connected. For example, when the effective display region is rectangular, the diagonal line of the rectangle is the maximum diameter. When the effective display region is circular, the diameter of the circle is the maximum diameter.

Antireflective Article

The antireflective article of the present disclosure includes the aforementioned antireflective member on a member disposed such that a surface of the antireflective member on the low refractive index layer side is disposed so as to face the opposite side to the member, the antireflective member being disposed on an outermost surface.

The member and the antireflective member are preferably laminated via an adhesive layer.

Examples of the member include an instrument panel, a watch, a showcase, a shop window, and a window. The member may be transparent or non-transparent, and the color tone is also not particularly limited.

Method for Selecting Antireflective Member

The method for selecting an antireflective member of the present disclosure includes performing evaluation with respect to the following condition 1 on an antireflective member comprising a low refractive index layer on an optically transmissive substrate, the low refractive index layer containing a binder resin and hollow particles; and selecting an antireflective member satisfying the following condition 1.

<Condition 1>

In a region of 5 μm×5 μm on a surface of the antireflective member on a side having the low refractive index layer with respect to the optically transmissive substrate, spatial frequency analysis of elevation is performed to calculate power spectrum intensity of elevation for each wavelength; after calculating a sum of power spectrum intensities of elevations at all measurement wavelengths, the sum is normalized to 1; and when power spectrum intensity of elevation at a wavelength of 1.25 μm to the sum of power spectrum intensities of elevations normalized to 1 is defined as P1, P1 is 0.015 or more.

The method for selecting an antireflective member of the present disclosure can efficiently select an antireflective member having good scratch resistance by selecting an antireflective member that satisfies the condition 1.

A preferred embodiment of the condition 1 is in accordance with the preferred embodiment of the antireflective member of the present disclosure described above.

For example, in condition 1, P1 is preferably 0.017 or more, more preferably 0.020 or more, more preferably 0.025 or more, more preferably 0.028 or more, more preferably 0.030 or more, more preferably 0.032 or more, and more preferably 0.035 or more. Furthermore, for example, P1 is preferably 0.075 or less, more preferably 0.070 or less, more preferably 0.060 or less, more preferably 0.055 or less, more preferably 0.050 or less, and more preferably 0.045 or less.

Preferably, the method for selecting an antireflective member of the present disclosure further has an additional determination condition. Examples of the additional determination condition include embodiments exemplified as preferred embodiments in the antireflective member of the present disclosure described above.

Specific examples of additional determination conditions include the following. That is, the method for selecting an antireflective member of the present disclosure preferably has one or more selected from the following additional determination conditions.

<Additional Determination Condition 1>

As in the condition 1, after calculating the sum of power spectrum intensities of elevations at all measurement wavelengths, the sum is normalized to 1; and when power spectrum intensity of elevation at a wavelength of 0.075 μm to the sum of power spectrum intensities of elevations normalized to 1 is defined as P2, P1/P2 is 4.0 or more.

<Additional Determination Condition 2>

The antireflective member has a total optical transmittance of 70% or more in accordance with JIS K7361-1:1997.

<Additional Determination Condition 3>

The luminous reflectance Y value, as measured at an incident angle of light of 5 degrees from the side having the low refractive index layer with respect to the optically transmissive substrate, is 1.0% or less.

<Additional Determination Condition 4>

The steel wool resistance of the surface on the low refractive index layer side is 750 g or more under illumination of fluorescent lamp.

<Additional Determination Condition 5>

The surface on the low refractive index layer side has an arithmetic mean roughness Ra of 0.05 μm or less, in accordance with JIS B0601:1994 at a cutoff value of 0.8 mm.

Examples

Next, the present disclosure will be described in more detail with reference to Examples, but the present disclosure is not limited by these Examples. "Parts" and "%" are based on mass unless otherwise specified.

1. Measurement and Evaluation

The antireflective members of Examples and Comparative Examples were measured and evaluated as follows. The atmosphere during each measurement and evaluation was set at a temperature of 23±5° C. and a relative humidity of 40% or more and 65% or less. In addition, before starting each measurement and evaluation, the target sample was exposed to the atmosphere for 30 minutes or more, and then the measurement and evaluation were performed.

1-1. Power Spectrum Intensity of Elevation

The antireflective members of Examples and Comparative Examples were cut into 5 mm×5 mm. The cutting site was selected from random sites after visually confirming that there were no abnormal points such as dust and scratches. The optically transmissive substrate side of the cut antireflective member was adhered to a metal disk for AFM measurement through a double-sided adhesive tape to prepare a produce sample A.

The shape of the surface on the low refractive index layer side of the sample A was measured using an atomic force microscope (trade name "MultiMode 8" for an AFM body and trade name "NanoScope V" for an AFM controller, manufactured by Bruker Corporation). Measurement conditions are shown below. Thereafter, a tilt correction process and a power spectrum conversion process were performed using analysis software (NanoScope Analysis) attached to the atomic force microscope.

<AFM Measurement Conditions>

AFM body: trade name "MultiMode 8" manufactured by Bruker Corporation

AFM controller: trade name "NanoScope V" manufactured by Bruker Corporation

Mode: tapping mode

Probe: "item number: RTESP300" manufactured by Bruker Corporation (resonance frequency: 300 kHz, spring constant: 40 N/m)

Number of pixels: 512×512

Scanning speed: 0.6 Hz or more and 1 Hz or less

Scan range: 5 μm×5 μm

<AFM Analysis Conditions>

Tilt correction: plane fit

Table 1 shows P1 under condition 1 and P1/P2 under condition 2.

FIGS. 8 to 15 show a ratio of power spectrum intensity of elevation at each wavelength to a sum of power spectrum intensities of elevations at all measurement wavelengths to the antireflective member of Examples 1 to 4 and Comparative Examples 1 to 4, provided that the sum is normalized to 1. In FIGS. 8 to 15, the horizontal axis represents the wavelength (unit: "μm"), and the vertical axis represents the ratio of power spectrum intensity of each wavelength to the sum (unit: non-dimensional).

1-2. Luminous Reflectance Y Value

The antireflective members of Examples and Comparative Examples were cut into 5 cm×5 cm. The cutting site was selected from random sites after visually confirming that there were no abnormal points such as dust and scratches. The optically transmissive substrate side of the cut antireflective member was adhered to a black plate (Kuraray Co., Ltd., trade name: Comoglass DFA2CG 502K (black) Series, thickness 2 mm) having a size of vertical 5 cm×horizontal 5 mm through an optically transparent adhesive sheet (trade name: Panaclean PD-S1) manufactured by Panac Co., Ltd. to produce a sample B.

Light was incident on the sample B from a direction of 5 degrees when the direction perpendicular to the surface of the sample B on the low refractive index layer side was set at 0 degrees, and the reflectance (luminous reflectance Y value) of the sample was measured based on specular reflected light of incident light.

The reflectance was determined as a value representing a luminous reflectance obtained by performing measurement using a spectral reflectometer (trade name: UV-2450 manufactured by Shimadzu Corporation) at a wavelength range of 380 nm or more and 780 nm or less, and thereafter performing calculation by software (UVPC color measurement Version 3.12 built in apparatus, conditions for calculating reflectance: C light source, viewing angle of 2 degrees) for conversion into brightness sensed by human eyes. The results are shown in Table 1.

1-3. Total Optical Transmittance (Tt) and Haze (Hz)

The antireflective members of Examples and Comparative Examples were cut into 10 cm squares. The cutting site was selected from random sites after visually confirming that there were no abnormal points such as dust and scratches. The total optical transmission in accordance with JIS K7361-1:1997 and the haze in accordance with JIS K7136:2000 of each sample were measured under the following conditions using a haze meter (HM-150, manufactured by Murakami Color Research Laboratory Co., Ltd.). The results are shown in Table 1.

In order to stabilize the light source, the power switch of the apparatus was turned on in advance and the apparatus was allowed to stand for 15 minutes or more, and then, calibration was performed without setting anything in the inlet opening where the measurement sample was to be installed. Thereafter, the measurement sample was set at the inlet opening, and the total optical transmittance and the haze were measured. The light incident surface during measurement was on the optically transmissive substrate side.

1-4. Scratch Resistance

Both ends of a PET film (trade name: "COSMOSHINE A4300", manufactured by Toyobo Co., Ltd) were fixed to bases of a Gakushin rubbing tester (trade name: "SJTR-053", manufactured by SAM JEE TECH) with jigs. Steel wool #0000 (trade name "Bonstar B-204", manufactured by Nippon Steel Wool Co., Ltd.) was set and brought into contact with the surfaces of the PET films, and the steel wool was stroked 200 times at a moving speed of 100 mm/sec and a moving distance per stroke of 200 mm (one-way moving distance: 100 mm) while applying a 500 g load. The operations described above are commonly performed to suppress variation between tests. The contact area between the steel wool and the PET film was 4 cm$^2$.

Thereafter, the PET film was removed, and each antireflective member of Examples and Comparative Examples was fixed to the base of the Gakushin rubbing tester in the same manner with the surface on the low refractive index layer side facing upward, and steel wool was stroked 10 times at a moving speed of 100 mm/sec and a moving distance per stroke of 200 mm (one-way moving distance: 100 mm) while applying a load. The test environment was a temperature of 23±1° C. and a relative humidity of 50±5%, unless otherwise specified. The Bonstar B-204 had a commercial size of a width of about 390 mm, a length of about 75 mm, and a thickness of about 110 mm.

After that, each antireflective member was observed with the naked eye under illumination of a fluorescent lamp to evaluate the number of scratches. A three-wavelength fluorescent lamp (model number: FHF32EX-N-H) manufactured by Panasonic Corporation was used as a fluorescent lamp. The illuminance on the sample was 800 Lx or more and 1200 Lx or less. The observation distance was 30 cm. The steel wool resistance was represented by the maximum load (g) per unit area when no scratch was observed and the number of scratches was 0 after the test. Examples and Comparative Examples were each tested with n=3, and the average was taken as the steel wool resistance of each Example and Comparative Example.

2. Preparation of Antireflective Member

Example 1

A coating solution for a hardcoat layer 1 having the following formulation was applied onto a triacetyl cellulose film having a thickness of 80 μm, and then dried at 70° C. for 1 minute to vaporize the solvent. Subsequently, a hardcoat layer having a dry film thickness of 10 μm was formed by ultraviolet irradiation at a cumulative light amount of 100 mJ/cm2.

Next, a coating solution for a high refractive index layer 1 having the following formulation was applied onto the hardcoat layer, and then was dried at 70° C. for 1 minute to evaporate the solvent. Subsequently, a high refractive index layer having a dry film thickness of 150 nm was formed by ultraviolet irradiation at a cumulative light amount of 100 mJ/cm$^2$.

Next, a coating solution for a low refractive index layer 1 having the following formulation was applied onto the high refractive index layer, and then was dried at 50° C. for 30 seconds (dry wind speed: 0.5 m/s), and then dried at 50° C. for 30 seconds (dry wind speed: 5 m/s) to vaporize the solvent. Subsequently, a low refractive index layer having a dry film thickness of 100 nm was formed by ultraviolet irradiation at a cumulative light amount of 200 mJ/cm$^2$ whereby the antireflective member of Example 1 was obtained.

<Coating Solution for Hardcoat Layer 1>
Ultraviolet curable acrylate-containing composition: 22 parts by mass (manufactured by Toagosei Co., Ltd., trade name "ARONIX M-450", solid content: 100%)
Ultraviolet curable acrylate-containing composition: 17 parts by mass (DKS Co. Ltd., trade name "NewFrontier R-1403MB", solid content: 80%)
Fluorine leveling agent: 1 part by mass
(DIC Corporation, trade name "MEGAFACE F-568")
Photopolymerization initiator: 1 part by mass
(IGM Resins B.V., trade name "Omnirad184")
Methyl isobutyl ketone: 15 parts by mass
Methyl ethyl ketone: 44 parts by mass
<Coating Solution for Forming High Refractive Index Layer 1>
PETA: 1.5 parts by mass
(manufactured by Toagosei Co., Ltd., trade name "ARONIX M-305", solid content: 100%)
High refractive index particles: 4.5 parts by mass
(Nippon Shokubai Co., Ltd., trade name "Zircostar", solid content: 70%)
Fluorine leveling agent: 0.01 part by mass
(DIC Corporation, trade name "MEGAFACE F251")
Photopolymerization initiator: 0.14 part by mass
(manufactured by IGM Resins B.V., trade name "Omnirad127")
Methyl isobutyl ketone: 47.6 parts by mass
Propylene glycol monomethyl ether 47.6 parts by mass
<Coating Solution for Forming Low Refractive Index Layer 1>
Polyfunctional acrylate composition: 100 parts by mass (manufactured by DKS Co. Ltd., trade name "NewFrontier MF-001")
Hollow silica particles: 200 parts by mass
(average primary particle size of 75 nm, particles surface-treated with a silane coupling agent having a methacryloyl group)
Solid silica particles: 110 parts by mass
(average primary particle size of 12.5 nm, particles surface-treated with a silane coupling agent having a methacryloyl group)
Silicone leveling agent: 13 parts by mass
(Shin-Etsu Chemical Co., Ltd., trade name "X-22-164E")
Photopolymerization initiator: 4.3 parts by mass
(IGM Resins B.V., trade name "Omnirad127")
Solvent: 14,867 parts by mass (mixed solvent of methyl isobutyl ketone and 1-methoxy-2-propyl acetate, mass ratio=68/32)

Example 2

An antireflective member of Example 2 was obtained in the same manner as in Example 1, except that the coating solution for a low refractive index layer 1 was changed to the coating solution for a low refractive index layer 2 below.
<Coating Solution for Forming Low Refractive Index Layer 2>
Polyfunctional acrylate composition: 100 parts by mass (manufactured by DKS Co. Ltd., trade name "NewFrontier MF-001")
Hollow silica particles: 200 parts by mass
(average primary particle size of 75 nm, particles surface-treated with a silane coupling agent having a methacryloyl group)
Solid silica particles: 85 parts by mass
(average primary particle size of 12.5 nm, particles surface-treated with a silane coupling agent having a methacryloyl group)
Silicone leveling agent: 13 parts by mass
(Shin-Etsu Chemical Co., Ltd., trade name "X-22-164E")
Photopolymerization initiator: 4.3 parts by mass
(IGM Resins B.V., trade name "Omnirad127")
Solvent: 14,867 parts by mass
(mixed solvent of methyl isobutyl ketone and 1-methoxy-2-propyl acetate, mass ratio=68/32)

Example 3

An antireflective member of Example 3 was obtained in the same manner as in Example 1, except that the hollow silica particles of the coating solution for a low refractive index layer 1 were changed to hollow silica particles having an average primary particle size of 60 nm and surface-treated with a silane coupling agent having a methacryloyl group.

Example 4

An antireflective member of Example 4 was obtained in the same manner as in Example 1, except that the silicone leveling agent of the coating solution for a low refractive index layer 1 was changed to a fluorosilicone leveling agent (manufactured by Shin-Etsu Chemical Co., Ltd., trade name: "X-71-1203M", solids content: 20% by mass, solvent: methyl isobutyl ketone).

Comparative Example 1

An antireflective member of Comparative Example 1 was obtained in the same manner as in Example 1, except that the coating solution for a low refractive index layer 1 was changed to the coating solution for a low refractive index layer 4 below.
<Coating Solution for Forming Low Refractive Index Layer 4>
PETA: 10 parts by mass
(manufactured by Nippon Kayaku Co., Ltd., trade name "KAYARAD PET-30", solid content: 100%)
Fluorine-containing compound containing a (meth)acryloyl group, silane unit having reactivity, and silane unit having a perfluoropolyether group, 90% parts by mass (manufactured by Shin-Etsu Chemical Co., Ltd., trade name "X-71-1203M"), solid content: 20% by mass, solvent: methyl isobutyl ketone)
Hollow silica particles: 140 parts by mass
(average primary particle size of 75 nm, particles surface-treated with a silane coupling agent having a methacryloyl group)
Solid silica particles: 25 parts by mass
(average primary particle size of 12.5 nm, particles surface-treated with a silane coupling agent having a methacryloyl group)
Photopolymerization initiator: 4.3 parts by mass
(IGM Resins B.V., trade name "Omnirad127")
Solvent: 10,684 parts by mass
(mixed solvent of methyl isobutyl ketone and propylene glycol monomethyl ether, mass ratio=68/32)

Comparative Example 2

The coating solution for a high refractive index layer 1 was changed to the coating solution for a high refractive index layer 2 below. Further, an antireflective member of Comparative Example 2 was obtained in the same manner as in Example 1, except that the coating solution for a low refractive index layer 1 was changed to a coating solution for a low refractive index layer 5 described below, and the drying condition for applying the low refractive index layer was set to 50° C. for 1 minute (drying wind speed: 5 m/s).
<Coating Solution for Forming High Refractive Index Layer 2>
PETA: 0.68 parts by mass
(manufactured by Nippon Kayaku Co., Ltd., trade name "KAYARAD PET-30", solid content: 100%)
High refractive index particles: 6.71 parts by mass
(manufactured by JGC C&C, trade name "ELCOM V-4564" (containing antimony pentoxide particles), solid content: 40.5%)
Fluorine leveling agent: 2.03 parts by mass
(manufactured by DIC Corporation, trade name "MEGA-FACE F251")
Photopolymerization initiator: 0.05 parts by mass
(manufactured by IGM Resins B.V., trade name "Omnirad127")
Methyl isobutyl ketone: 46.3 parts by mass
Propylene glycol monomethyl ether 44.23 parts by mass
<Coating Solution for Forming Low Refractive Index Layer 5>
PETA: 50 parts by mass
(manufactured by Nippon Kayaku Co., Ltd., trade name "KAYARAD PET-30", solid content: 100%)
Fluorine-containing compound containing a (meth)acryloyl group, silane unit having reactivity, and silane unit having a perfluoropolyether group, 50% parts by mass
(manufactured by Shin-Etsu Chemical Co., Ltd., trade name "X-71-1203M"), solid content: 20% by mass, solvent: methyl isobutyl ketone)
Hollow silica particles: 200 parts by mass
(average primary particle size of 65 nm, particles surface-treated with a silane coupling agent having a methacryloyl group)
Solid silica particles: 30 parts by mass
(average primary particle size of 12.5 nm, particles surface-treated with a silane coupling agent having a methacryloyl group)
Photopolymerization initiator: 4.3 parts by mass
(IGM Resins B.V., trade name "Omnirad127")
Solvent: 12,870 parts by mass (mixed solvent of methyl isobutyl ketone and 1-methoxy-2-propyl acetate, mass ratio=89/11)

Comparative Example 3

The coating solution for a high refractive index layer 1 was changed to the coating solution for a high refractive index layer 2 above. Further, an antireflective member of Comparative Example 3 was obtained in the same manner as in Example 1, except that the coating solution for a low refractive index layer 1 was changed to a coating solution for a low refractive index layer 6 described below, and the drying condition for applying the low refractive index layer was set to 50° C. for 1 minute (drying wind speed: 5 m/s).
<Coating Solution for Forming Low Refractive Index Layer 6>
PETA: 70 parts by mass
(manufactured by Nippon Kayaku Co., Ltd., trade name "KAYARAD PET-30", solid content: 100%)
Fluorine-containing compound containing a (meth)acryloyl group, silane unit having reactivity, and silane unit having a perfluoropolyether group, 30% parts by mass
(manufactured by Shin-Etsu Chemical Co., Ltd., trade name "X-71-1203M"), solid content: 20% by mass, solvent: methyl isobutyl ketone)
Hollow silica particles: 135 parts by mass
(average primary particle size of 75 nm, particles surface-treated with a silane coupling agent having a methacryloyl group)
Solid silica particles: 10 parts by mass
(average primary particle size of 12.5 nm, particles surface-treated with a silane coupling agent having a methacryloyl group)
Photopolymerization initiator: 4.3 parts by mass
(IGM Resins B.V., trade name "Omnirad127")
Solvent: 9,746 parts by mass
(mixed solvent of methyl isobutyl ketone and 1-methoxy-2-propyl acetate, mass ratio=89/11)

Comparative Example 4

An antireflective member of Comparative Example 4 was obtained in the same manner as in Comparative Example 1, except that the content of the hollow silica particles in the coating solution for a low refractive index layer 4 was changed to 200 parts by mass.

TABLE 1

|  | P1 | P1/P2 | Y value (%) | Tt (%) | Hz (%) | Scratch resistance (g) |
|---|---|---|---|---|---|---|
| Example 1 | 0.0387 | 10.4825 | 0.35 | 95.8 | 0.4 | 1500 |
| Example 2 | 0.0283 | 5.5491 | 0.35 | 95.5 | 0.4 | 1200 |
| Example 3 | 0.0429 | 15.3210 | 0.80 | 95.5 | 0.5 | 2000 |
| Example 4 | 0.0176 | 4.0930 | 0.35 | 95.8 | 0.3 | 800 |
| Comparative Example 1 | 0.0119 | 1.9875 | 0.10 | 95.9 | 0.4 | 300 |
| Comparative Example 2 | 0.0120 | 1.7839 | 0.15 | 95.8 | 0.3 | 100 |
| Comparative Example 3 | 0.0126 | 1.6979 | 0.30 | 95.9 | 0.3 | 400 |
| Comparative Example 4 | 0.0107 | 1.6260 | 0.06 | 95.8 | 0.4 | <100 |

From the results in Table 1, it can be confirmed that the antireflective members of Examples satisfying the condition 1 have good scratch resistance in spite of containing hollow particles having low strength.

It is considered that in the antireflective members of Examples 1 to 4, the content of the solid silica to hollow silica is large, and the initial drying of the low refractive index layer is slow, and thus the condition 1 is easily satisfied.

On the other hand, in the antireflective members of Comparative Examples 1 and 4, the acrylate resin as the binder resin of the low refractive index layer is small, and the content of solid silica is small, and thus the condition 1 is not easily satisfied. It is considered that in the antireflective members of Comparative Examples 2 and 3, the content of the solid silica is small, and the initial drying of the low refractive index layer is fast, and thus the condition 1 is not easily satisfied.

REFERENCE SIGNS LIST

10: optically transmissive substrate
20: hardcoat layer
30: high refractive index layer
40: low refractive index layer
41: binder resin
42: hollow particles
100: antireflective member
110: display element
120: image display device

The invention claimed is:

1. An antireflective member comprising a low refractive index layer on an optically transmissive substrate, the low refractive index layer comprising a binder resin and hollow particles, wherein the antireflective member satisfies the following condition 1:

<condition 1>
    in a region of 5 μm×5 μm on a surface of the antireflective member on a side having the low refractive index layer with respect to the optically transmissive substrate, spatial frequency analysis of elevation is performed to calculate power spectrum intensity of elevation for each wavelength; after calculating a sum of power spectrum intensities of elevations at all measurement wavelengths, the sum is normalized to 1; and when a ratio of a power spectrum intensity of elevation at a wavelength of 1.25 μm to the sum of power spectrum intensities of elevations normalized to 1 is defined as P1, P1 is 0.015 or more.

2. The antireflective member according to claim 1, wherein in the condition 1, P1 is 0.025 or more.

3. The antireflective member according to claim 1, further satisfying the following condition 2:

<condition 2>
    as in the condition 1, after calculating the sum of power spectrum intensities of elevations at all measurement wavelengths, the sum is normalized to 1; and when a ratio of a power spectrum intensity of elevation at a wavelength of 0.075 μm to the sum of power spectrum intensities of elevations normalized to 1 is defined as P2, P1/P2 is 4.0 or more.

4. The antireflective member according to claim 1, wherein the hollow particles have an average primary particle size of 50 nm or more and 100 nm or less.

5. The antireflective member according to claim 1, possessing one or more layers between the optically transmissive substrate and the low refractive index layer selected from the group consisting of a hardcoat layer and a high refractive index layer.

6. The antireflective member according to claim 1, having a haze of 1.0% or less according to JIS K7136:2000.

7. The antireflective member according to claim 1, wherein a luminous reflectance Y value, as measured at an incident angle of light of 5 degrees from the side having the low refractive index layer with respect to the optically transmissive substrate, is 1.0% or less.

8. A polarizing plate comprising a polarizer, a first transparent protective plate disposed on one side of the polarizer, and a second transparent protective plate disposed on the other side of the polarizer, wherein any one of the first transparent protective plate and the second transparent protective plate is the antireflective member according to claim 1, and the antireflective member is disposed such that a surface of the antireflective member on the optically transmissive substrate side faces the polarizer side.

9. An image display device comprising:
    a display element; and
    the antireflective member according to claim 1 disposed on the display element such that a surface of the antireflective member on the low refractive index layer side is disposed so as to face the opposite side to the display element, the antireflective member being disposed on an outermost surface.

10. An antireflective article wherein the antireflection member according to claim 1 is disposed on a member so that the surface on the low refractive index layer side faces the side opposite the member, and in which the antireflection member is positioned on the outermost surface.

11. A method for selecting an antireflective member, the method comprising:
    performing evaluation with respect to the following condition 1 on an antireflective member comprising a low refractive index layer on an optically transmissive substrate, the low refractive index layer comprising a binder resin and hollow particles; and
    selecting an antireflective member satisfying the following condition 1:
<condition 1>
    in a region of 5 μm×5 μm on a surface of the antireflective member on a side having the low refractive index layer with respect to the optically transmissive substrate, spatial frequency analysis of elevation is performed to calculate power spectrum intensity of elevation for each wavelength; after calculating a sum of power spectrum intensities of elevations at all measurement wavelengths, the sum is normalized to 1; and when a ratio of a power spectrum intensity of elevation at a wavelength of 1.25 μm to the sum of power spectrum intensities of elevations normalized to 1 is defined as P1, P1 is 0.015 or more.

12. The method for selecting an antireflective member according to claim 11, wherein in the condition 1, P1 is 0.025 or more.

* * * * *